United States Patent
Kinoshita et al.

(10) Patent No.: US 10,811,525 B2
(45) Date of Patent: Oct. 20, 2020

(54) BIDIRECTIONAL SWITCH

(71) Applicant: PANASONIC CORPORATION, Osaka (JP)

(72) Inventors: Yusuke Kinoshita, Kyoto (JP); Hidekazu Umeda, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/125,174

(22) Filed: Sep. 7, 2018

(65) Prior Publication Data

US 2019/0006499 A1 Jan. 3, 2019

Related U.S. Application Data

(63) Continuation of application No. PCT/JP2017/009700, filed on Mar. 10, 2017.

(30) Foreign Application Priority Data

Mar. 15, 2016 (JP) .................. 2016-050347

(51) Int. Cl.
*H01L 29/778* (2006.01)
*H01L 29/10* (2006.01)
*H02M 5/293* (2006.01)
*H01L 27/06* (2006.01)
*H01L 21/8252* (2006.01)
*H01L 29/861* (2006.01)
*H01L 29/423* (2006.01)
*H01L 29/20* (2006.01)

(52) U.S. Cl.
CPC ........ *H01L 29/778* (2013.01); *H01L 21/8252* (2013.01); *H01L 27/0605* (2013.01); *H01L 27/0629* (2013.01); *H01L 29/1066* (2013.01); *H01L 29/42316* (2013.01); *H01L 29/7786* (2013.01); *H01L 29/861* (2013.01); *H02M 5/293* (2013.01); *H01L 29/2003* (2013.01)

(58) Field of Classification Search
None
See application file for complete search history.

(56) References Cited

U.S. PATENT DOCUMENTS 8,593,068 B2 * 11/2013 Hashizume ....... H01L 29/42316
 315/209 R
9,960,157 B2 * 5/2018 Prechtl ................ H01L 21/8258
(Continued)

FOREIGN PATENT DOCUMENTS

| JP | 2009-200149 A | 9/2009 |
|---|---|---|
| WO | 2008/062800 A1 | 5/2008 |
| WO | 2011/064955 A1 | 6/2011 |

OTHER PUBLICATIONS

International Search Report and Written Opinion issued in Application No. PCT/JP2017/009700 dated Jun. 6, 2017.

*Primary Examiner* — Steven M Christopher
(74) *Attorney, Agent, or Firm* — McDermott Will & Emery LLP

(57) ABSTRACT

A bidirectional switch includes a semiconductor element and a substrate potential stabilizer which stabilizes a substrate potential of a semiconductor element. The substrate potential stabilizer includes a first switch element and a second switch element. Both the first switch element and the second switch element are on when the semiconductor element is on.

9 Claims, 18 Drawing Sheets

(56) References Cited

U.S. PATENT DOCUMENTS

| | | | |
|---|---|---|---|
| 2009/0167411 A1* | 7/2009 | Machida | H01L 27/0605 327/427 |
| 2009/0206363 A1 | 8/2009 | Machida et al. | |
| 2010/0097105 A1 | 4/2010 | Morita et al. | |
| 2012/0217542 A1* | 8/2012 | Morita | H01L 27/0605 257/140 |

* cited by examiner

BIDIRECTIONAL SWITCH

CROSS REFERENCE TO RELATED APPLICATIONS

This application is a U.S. continuation application of PCT International Patent Application Number PCT/JP2017/009700 filed on Mar. 10, 2017, claiming the benefit of priority of Japanese Patent Application Number 2016-050347 filed on Mar. 15, 2016, the entire contents of which are hereby incorporated by reference.

BACKGROUND

1. Technical Field

The present disclosure relates to a bidirectional switch used for, for example, a main switch of a matrix converter and a semiconductor relay.

2. Description of the Related Art

The bidirectional switch passes current bidirectionally, and has a voltage resistance and is resistant to bipolar voltage. For example, the bidirectional switch is used as a main switch of a matrix converter capable of converting power highly efficiently, a main switch of a semiconductor relay, or the like.

It is expected that a semiconductor material having a wide band gap such as a nitride semiconductor etc. represented by GaN will be used to reduce ON resistance of the bidirectional switch. In particular, it is possible to form a bidirectional switch by configuring a heterojunction field effect transistor (HFET) using a heterojunction of AlGaN and GaN to have a dual gate structure (for example, International Publication No. WO2008/062800). For this reason, it is possible to reduce the number of components of a bidirectional switch, and to reduce ON loss of the bidirectional switch.

In comparison, in a bidirectional switch having a dual gate HFET, the potential of a substrate needs to be stabilized in order to stably operate the bidirectional switch. International Publication No. WO2011/064955 and Japanese Unexamined Patent Application Publication No. 2009-200149 disclose a configuration including a substrate potential stabilizer which applies, to a substrate, a potential having a value close to a value of a lower one of a potential of a first ohmic electrode and a potential of a second ohmic electrode of a dual gate HFET. More specifically, a diode and a resistor are disclosed as the substrate potential stabilizer.

SUMMARY

However, the bidirectional switch having the dual gate HFET does not sufficiently stabilize a substrate potential, and thus a switch operation may be unstable.

The present disclosure was made considering the above problem, and has a main object to provide a bidirectional switch which operates while stabilizing a potential of a substrate even when the bidirectional switch has a dual gate HFET.

The bidirectional switch according to an aspect of the present disclosure includes a substrate potential stabilizer which increases the potential of the substrate when the potential of the substrate is lower than each of the potential of the first ohmic electrode and the potential of the second ohmic electrode when the switch is on.

A bidirectional switch according to an aspect of the present disclosure includes a semiconductor element and a substrate potential stabilizer. The semiconductor element includes a substrate and a semiconductor stack on a first surface of the substrate. The semiconductor element further includes: a first ohmic electrode and a second ohmic electrode on the semiconductor stack, the first ohmic electrode and the second ohmic electrode being spaced apart from each other; a first gate electrode and a second gate electrode between the first ohmic electrode and the second ohmic electrode, in order starting from a side of the first ohmic electrode; and a rear surface electrode on a second surface of the substrate opposite to the first surface on which the semiconductor stack is formed. The substrate potential stabilizer includes: a first switch element which connects the first ohmic electrode and the rear surface electrode; and a second switch element which connects the second ohmic electrode and the rear surface electrode. Both the first switch element and the second switch element are conductive when the semiconductor element is on.

This configuration having the substrate potential stabilizer enables implementation of a bidirectional switch which operates stably without making the potential of the substrate unstable.

A bidirectional switch according to an aspect of the present disclosure may be configured so that: the first switch element includes a first transistor, and the second switch element includes a second transistor. The first transistor may include a third ohmic electrode, a fourth ohmic electrode, and a third gate electrode between the third ohmic electrode and the fourth ohmic electrode. The second transistor may include a fifth ohmic electrode, a sixth ohmic electrode, and a fourth gate electrode between the fifth ohmic electrode and the sixth ohmic electrode. The third ohmic electrode and the first ohmic electrode may be connected to each other, the fourth ohmic electrode and the rear surface electrode may be connected to each other, the fifth ohmic electrode and the second ohmic electrode may be connected to each other, and the sixth ohmic electrode and the rear surface electrode may be connected to each other.

With this configuration, when the potential of the rear surface electrode is lower than one of the potential of the first ohmic electrode and the potential of the second ohmic electrode, it is possible to increase the potential of the substrate by turning on the first transistor and the second transistor.

A bidirectional switch according to an aspect of the present disclosure may be configured so that: in the first transistor, the third ohmic electrode is a source electrode, and the fourth ohmic electrode is a drain electrode, and in the second transistor, the fifth ohmic electrode is a source electrode, and the sixth ohmic electrode is a drain electrode.

With this configuration, when a body diode is formed in the first transistor and the second transistor, the rear surface electrode corresponds to a cathode. Thus, the diode is on when the potential of the rear surface electrode is lower than one of the potential of the first ohmic electrode and the potential of the second ohmic electrode. Accordingly, it is possible to increase the substrate potential to the potential that is lower than the one of the potential of the first ohmic electrode and the potential of the second ohmic electrode by the amount corresponding to a forward direction voltage of the diode.

A bidirectional switch according to an aspect of the present disclosure may be configured so that: in the first transistor, the third gate electrode is connected to the first gate electrode, and in the second transistor, the fourth gate electrode is connected to the second gate electrode.

With this configuration, the first transistor and the second transistor respectively turn on when two gates of the semiconductor element respectively turned on. Thus, when the potential of the rear surface electrode is lower than one of the potential of the first ohmic electrode and the potential of the second ohmic electrode, it is possible to increase the substrate potential via the first transistor and the second transistor.

A bidirectional switch according to an aspect of the present disclosure may be configured so that: when a potential of the second ohmic electrode is higher than a potential of the first ohmic electrode, the third gate electrode turns on before the first gate electrode, and when a potential of the first ohmic electrode is higher than a potential of the second ohmic electrode, the fourth gate electrode turns on before the second gate electrode.

With this configuration, it is possible to make the rear surface electrode and one of the first ohmic electrode and the second ohmic electrode which has a potential lower than the potential of the other conductive with each other in advance before the semiconductor element turns on, which can reduce change in potential of the substrate both in positive and negative directions. Thus, it is possible to implement the bidirectional switch which operates stably.

A bidirectional switch according to an aspect of the present disclosure may be configured so that: the semiconductor stack, the first switch element, and the second switch element include a nitride semiconductor.

With this configuration, it is possible to form the semiconductor element and the substrate potential stabilizer on a substrate, and reduce wiring inductance between the substrate potential stabilizer and the rear surface electrode. In this way, it is possible to quickly stabilize the substrate potential.

A bidirectional switch according to an aspect of the present disclosure includes a semiconductor element and a substrate potential stabilizer. The semiconductor element includes a substrate and a semiconductor stack on a first surface of the substrate. The semiconductor element further includes: a first ohmic electrode and a second ohmic electrode on the semiconductor stack, the first ohmic electrode and the second ohmic electrode being spaced apart from each other; a first gate electrode and a second gate electrode between the first ohmic electrode and the second ohmic electrode, in order starting from a side of the first ohmic electrode; and a rear surface electrode on a second surface of the substrate opposite to the first surface on which the semiconductor stack is formed. The substrate potential stabilizer includes: a first diode which connects the first ohmic electrode and the rear surface electrode; and a second diode which connects the second ohmic electrode and the rear surface electrode. A cathode of the first diode is connected to the rear surface electrode, and an anode of the first diode is connected to the first ohmic electrode, and a cathode of the second diode is connected to the rear surface electrode, and an anode of the second diode is connected to the second ohmic electrode.

With this configuration, the diode is on when the potential of the rear surface electrode is lower than one of the potential of the first ohmic electrode and the potential of the second ohmic electrode. Thus, it is possible to increase the substrate potential to the potential that is lower than the one of the potential of the first ohmic electrode and the potential of the second ohmic electrode by the amount corresponding to the forward direction voltage of the diode.

A bidirectional switch according to an aspect of the present disclosure includes a semiconductor element and a substrate potential stabilizer. The semiconductor element includes a substrate and a semiconductor stack on a first surface of the substrate. The semiconductor element further includes: a first ohmic electrode and a second ohmic electrode on the semiconductor stack, the first ohmic electrode and the second ohmic electrode being spaced apart from each other; a first gate electrode and a second gate electrode between the first ohmic electrode and the second ohmic electrode, in order starting from a side of the first ohmic electrode; and a rear surface electrode on a second surface of the substrate opposite to the first surface on which the semiconductor stack is formed. The substrate potential stabilizer includes: a first transistor which connects the first ohmic electrode and the rear surface electrode; and a second transistor which connects the second ohmic electrode and the rear surface electrode. The first transistor includes: a first source electrode; a first drain electrode; and a third gate electrode between the first source electrode and the first drain electrode. The second transistor includes: a second source electrode; a second drain electrode; and a fourth gate electrode between the second source electrode and the second drain electrode. The first source electrode is connected to the first ohmic electrode, the first drain electrode is connected to the rear surface electrode, the second drain electrode is connected to the rear surface electrode, and the second source electrode is connected to the second ohmic electrode. The substrate potential stabilizer includes a p-type semiconductor layer between the semiconductor stack and the third gate electrode, and a p-type semiconductor layer between the semiconductor stack and the fourth gate electrode, the third gate electrode is connected to the first source electrode, and the fourth gate electrode is connected to the second source electrode.

With this configuration, it is possible to regard the first transistor and the second transistor as the diodes each having a cathode connected to the rear surface electrode when the potential of the rear surface electrode is lower than one of the potential of the first ohmic electrode and the potential of the second ohmic electrode. Thus, it is possible to increase the substrate potential to the potential that is lower than the one of the potential of the first ohmic electrode and the potential of the second ohmic electrode by the amount corresponding to the forward direction voltage of the diode.

According to the present disclosure, it is possible to implement a bidirectional switch which operates stably even when a dual gate HFET is formed on the substrate.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, embodiments according to the present disclosure are described with reference to the drawings.

It is to be noted that a general expression of a nitride semiconductor is represented as $Al_xGa_{1-x-y}In_yN$ ($0 \leq x \leq 1$, $0 \leq y \leq 1$). Here, $Al_xGa_{1-z}N$ ($0 < z < 1$, aluminum gallium nitride) is written as AlGaN.

(Consideration of Compared Technique) A compared technique and a problem thereof are described before explaining a bidirectional switch according to the present disclosure.

Figure 14:
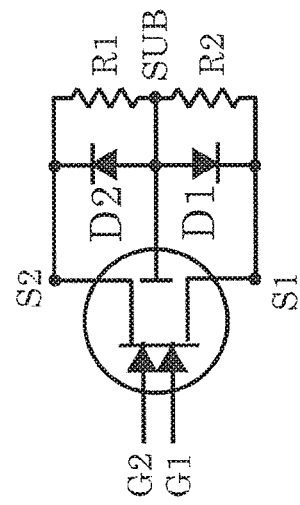
FIG. 14 is a diagram indicating a circuit configuration of a bidirectional switch including a dual gate transistor and a substrate stabilizer according to a compared technique.

FIG. 14 illustrates a circuit configuration of a bidirectional switch including a dual gate transistor and a substrate stabilizer according to a compared technique.

The dual gate transistor in the circuit configuration illustrated in FIG. 14, the dual gate transistor includes terminals S1 and S2, terminals G1 and G2, and substrate terminal SUB. Terminal S1 corresponds to one of a source terminal and a drain terminal of the dual gate transistor. Terminal S2 corresponds to one of a source terminal and a drain terminal of the dual gate transistor. The substrate stabilizer includes diodes D1 and D2 and resistors R1 and R2.

Figure 15:
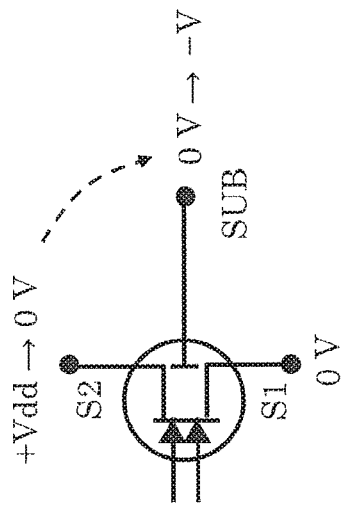
FIG. 15 is a diagram indicating a change in voltage in the substrate terminal of the dual gate transistor.

FIG. 15 is a diagram indicating a change in voltage in substrate terminal SUB of the dual gate transistor. In other words, when the voltage of terminal S1 of the dual gate transistor is set to 0 V, and the voltage of terminal S2 is changed from Vdd (positive value) to 0 V, the substrate is negatively charged, and the voltage in substrate terminal SUB may take a negative value (−V) as illustrated in FIG. 15. In this case, diodes D1 and D2 do not operate without resistors R1 and R2, and the substrate potential is not stabilized, which causes a problem that switch operations are unstable.

In addition, it is possible to increase the substrate potential via one of resistors R1 and R2 even when the potential of substrate terminal SUB is lower than the potentials of terminals S1 and S2.

When the resistance values of resistors R1 and R2 are large, the potential cannot be stabilized immediately, and it takes time for such stabilization. In addition, when the resistance values of resistors R1 and R2 are small, current always flows to resistors R1 and R2, which causes a problem that power loss is increased.

Next, a result of an experiment relating to such a problem and the evaluation are described.

In the circuit configuration illustrated in FIG. 14, the dual gate transistor is evaluated in a load switching circuit in which the dual gate transistor and a coil are connected in series.

Figure 16:
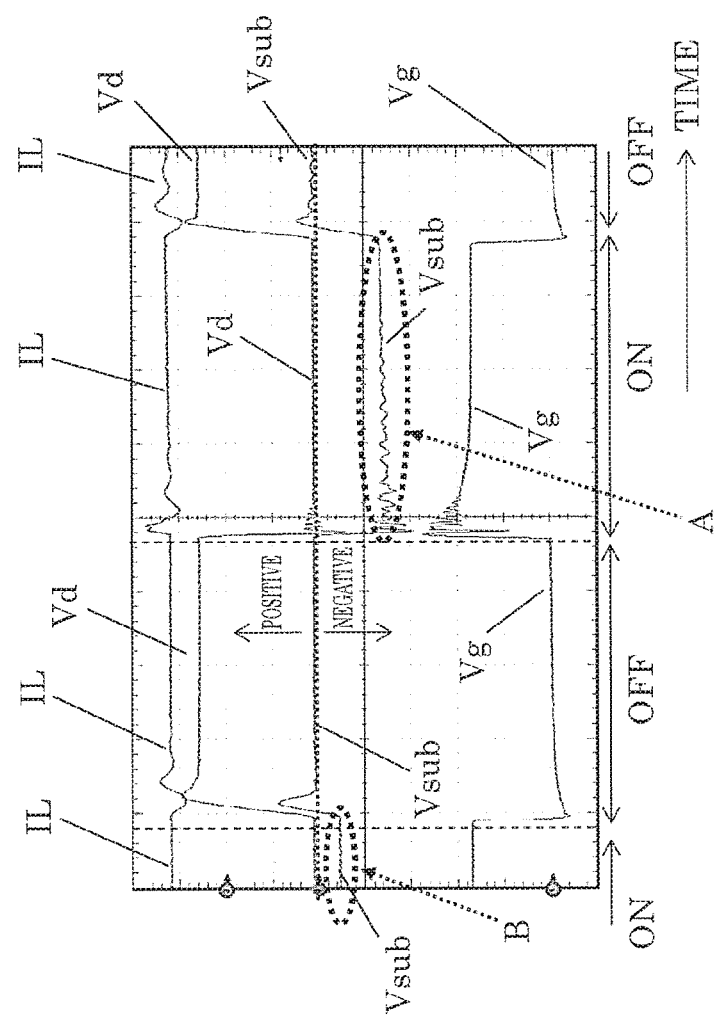
FIG. 16 is a diagram indicating results of measuring temporal change in the dual gate transistor, specifically, change in a voltage in a terminal, a voltage in a first gate terminal, a voltage in a substrate terminal, and in current that flows in a load (coil).

FIG. 16 is a diagram illustrating a result of measuring temporal change in the dual gate transistor, specifically change in voltage Vd of terminal S2, voltage Vg of terminal G1, potential Vsub in substrate terminal SUB, and current IL that flows in the load (coil). More specifically, the following states are alternately repeated: a state in which voltage Vg (for example, 3 V) is applied to terminal G1 out of two gate terminals of the dual gate transistor, terminal G2 is short-circuited with terminal S2, and the dual gate transistor is on; and a state in which terminal G1 is set to have 0 V without applying voltage Vg, and the dual gate transistor is off. The on and off of the dual gate transistor are both repeated at 2 microsecond intervals. Current IL that flows the coil increases when the dual gate transistor is on, and decreases when the dual gate transistor is off. Terminal S1 is set to 0 V, and the voltage of terminal S2 decreases when the dual gate transistor is on and increases when the dual gate transistor is off. Potential Vsub of substrate terminal SUB at that time was evaluated. It is to be noted that the values of resistors R1 and R2 are both 100 kΩ.

As illustrated in portion A enclosed by dotted lines in FIG. 16, it is known that substrate potential Vsub takes a negative value when Vg is 3 V and Vd is 0 V. In other words, substrate potential Vsub is still a negative voltage at portion A enclosed by dotted lines because charge release from the substrate is poor.

It is further known that, as in the cases of portions A and B enclosed by dotted lines, substrate potential Vsub is not a constant value at each ON time, and takes various values. In other words, it is known that the value of Vsub at the ON time of the dual gate transistor is unstable. Since substrate voltage Vsub is not stabilized as such, there is a problem that switch operations are unstable.

Embodiment 1

(Configuration of Bidirectional Switch 100)

Figure 1:
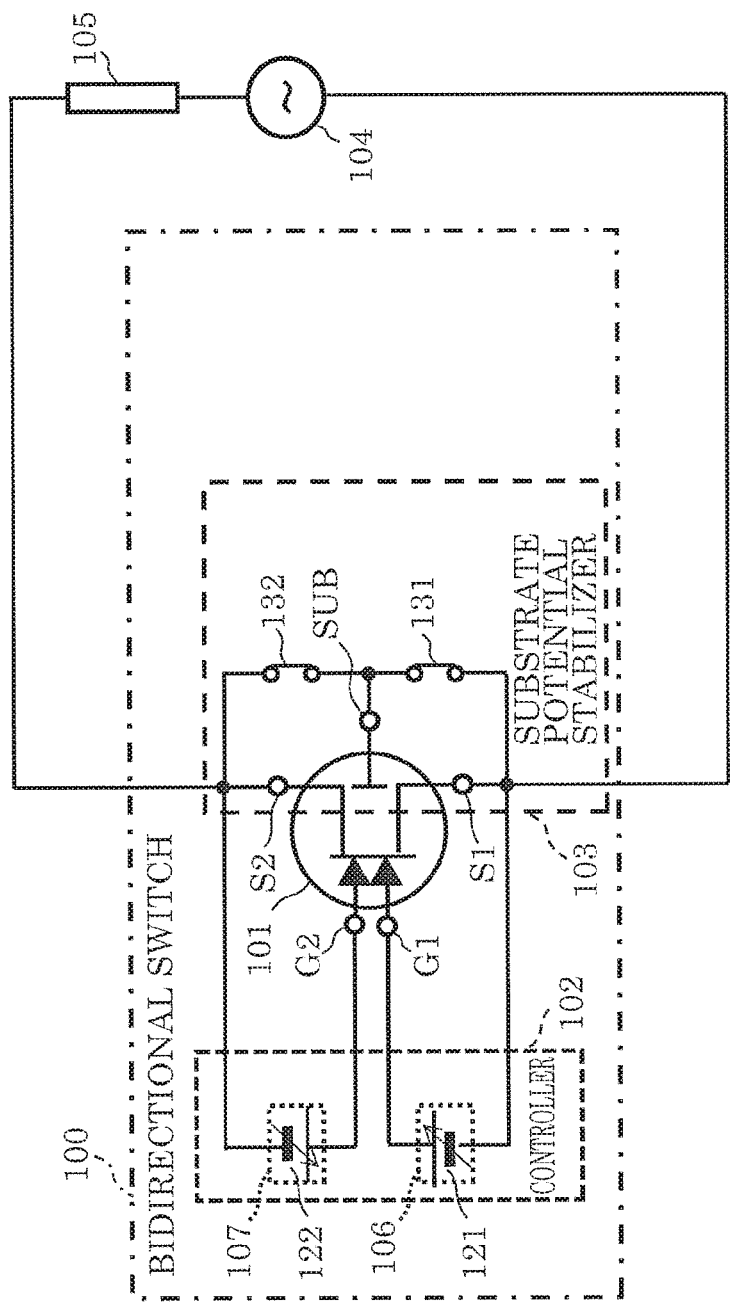
FIG. 1 is a diagram illustrating an example of a circuit configuration indicating a bidirectional switch according to Embodiment 1, a load, and a power supply.

Bidirectional switch 100 according to Embodiment 1 is described with reference to the drawings. FIG. 1 is a diagram illustrating an example of a circuit configuration indicating bidirectional switch 100 according to Embodiment 1, load 105, and power supply 104. As illustrated in FIG. 1, bidirectional switch 100 according to this embodiment includes: semiconductor element 101; controller 102 which controls operations by semiconductor element 101; and substrate potential stabilizer 103 which stabilizes substrate potential of semiconductor element 101.

Semiconductor element 101 is, for example, a dual gate HFET, and includes terminals S1 and S2, terminals G1 and G2, and substrate terminal SUB. Terminal S1 corresponds to one of a source terminal and a drain terminal of a dual gate transistor. Terminal S2 corresponds to the other one of the source terminal and the drain terminal of the dual gate transistor. Terminals G1 and G2 correspond to two gate terminals. Substrate terminal SUB is a terminal electrically connected to an electrode which covers the entire back surface of the substrate (for example, a substrate made of Si) on which semiconductor element 101 is formed.

Controller 102 includes first gate control circuit 106 and second gate control circuit 107. First gate control circuit 106 controls a bias voltage to be applied between terminal S1 and terminal G1 of semiconductor element 101. Second gate control circuit 107 controls a bias voltage to be applied between terminal S2 and terminal G2 of semiconductor element 101. In this way, it is possible to bidirectionally apply or stop applying current between terminal S1 and terminal S2 of semiconductor element 101. For this reason, it is possible to control operations of load 105 by connecting power supply 104 and load 105 connected between terminal S1 and terminal S2 of semiconductor element 101. First power supply 121 and second power supply 122 are respectively used as examples of first gate control circuit 106 and second gate control circuit 107. It is to be noted that first power supply 121 and second power supply 122 are variable power supplies.

Substrate potential stabilizer 103 includes first switch element 131 and second switch element 132. When semiconductor element 101 is turned on, as illustrated in FIG. 1, both first switch element 131 and second switch element 132 are short-circuited (turned on). In this way, it is possible to stably operate bidirectional switch 100. This is described below.

(Configuration of Semiconductor Element 101)

Figure 2:
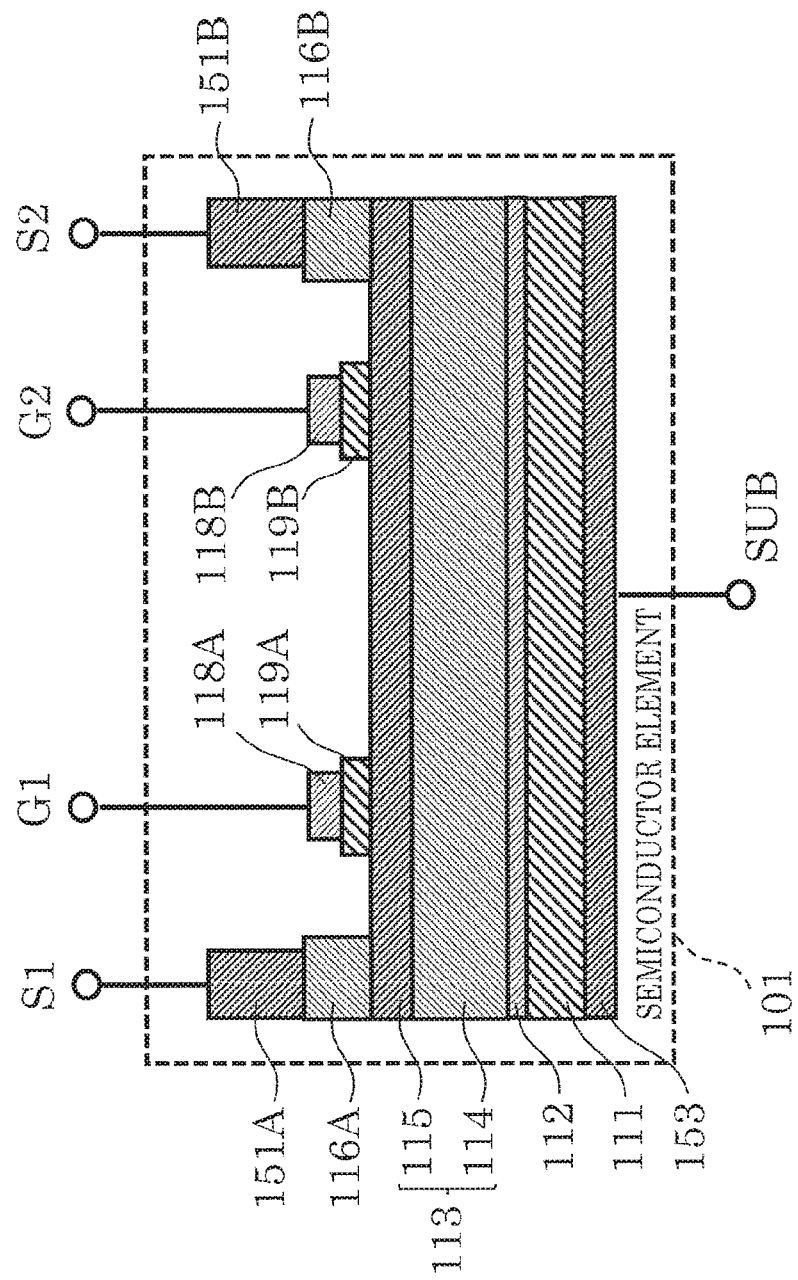
FIG. 2 is a cross sectional view of an example of a configuration of a semiconductor element included in the bidirectional switch according to Embodiment 1.

Hereinafter, bidirectional switch 100 according to this embodiment is described in detail. First, a configuration of semiconductor element 101 is explained. FIG. 2 is a cross sectional view of an example of a configuration of semiconductor element 101.

As illustrated in FIG. 2, semiconductor element 101 includes, for example, buffer layer 112 formed on substrate 111 made of silicon (Si) to have a thickness of approximately 1 μm and nitride semiconductor layer 113 formed on buffer layer 112. Buffer layer 112 includes a nitride aluminium (AlN) having a thickness of 10 nm and a nitride gallium (GaN) having a thickness of approximately 10 nm laminated alternately. Nitride semiconductor layer 113 includes first semiconductor layer 114 and second semiconductor layer 115 having a band gap larger than that of first semiconductor layer 114 laminated sequentially above the substrate. In this embodiment, first semiconductor layer 114 is an undoped nitride gallium (GaN) layer having a thickness of approximately 2 μm, and second semiconductor layer 115 is an undoped aluminium gallium nitride (AlGaN) layer having a thickness of approximately 50 nm. Hereinafter, a stack of buffer layer 112, first semiconductor layer 114, and second semiconductor layer 115 or a stack of first semiconductor layer 114 and second semiconductor layer 115 is referred to as a semiconductor stack. In other words, the semiconductor stack includes at least nitride semiconductor layer 113 (that is first semiconductor layer 114 and second semiconductor layer 115).

Due to spontaneous polarization and Piezo polarization, charge is generated at the heterojunction interface between first semiconductor layer 114 made of GaN and second semiconductor layer 115 made of AlGaN. In this way, a channel region that is a 2-dimensional electron gas (2DEG) layer is formed.

On nitride semiconductor layer 113, first ohmic electrode 116A and second ohmic electrode 116B are formed to be spaced apart from each other. First ohmic electrode 116A corresponds to one of the source terminal and the drain terminal of semiconductor element 101. Second ohmic electrode 116B corresponds to the other one of the source terminal and the drain terminal of semiconductor element 101. Each of first ohmic electrode 116A and second ohmic electrode 116B includes a titan (Ti) layer and an aluminum (Al) layer which are stacked, and forms an ohmic contact with the channel region.

S1 electrode wiring 151A including Au and Ti is formed on first ohmic electrode 116A, and is electrically connected to first ohmic electrode 116A. S2 electrode wiring 151B including Au and Ti is formed on second ohmic electrode 116B, and is electrically connected to second ohmic electrode 116B.

First p-type semiconductor layer 119A and second p-type semiconductor layer 119B are formed to be spaced apart from each other in a region between first ohmic electrode 116A and second ohmic electrode 116B on second semiconductor layer 115. First gate electrode 115A is formed on first p-type semiconductor layer 119A, and second gate electrode 118B is formed on second p-type semiconductor layer 119B. Each of first gate electrode 118A and second gate electrode 118B is composed of a stack of a palladium (Pd) layer and a gold (Au) layer, and forms an ohmic contact with a corresponding one of first p-type semiconductor layer 119A and second p-type semiconductor layer 119B.

Rear surface electrode 153 that is a stack of a nickel (Ni) layer, a chrome (Cr) layer, and a silver (Ag) layer, and has a thickness of approximately 400 nm is formed on a back surface of substrate 111. Rear surface electrode 153 forms an ohmic contact with substrate 111.

A terminal connected to first ohmic electrode 116A, a terminal connected to first gate electrode 118A, a terminal connected to second gate electrode 118B, and a terminal connected to second ohmic electrode 116B correspond to terminal S1, terminal G1, terminal G2, and terminal S2 in FIG. 1, respectively. The terminal connected to the rear surface electrode corresponds to substrate terminal SUB in FIG. 1.

Each of first p-type semiconductor layer 119A and second p-type semiconductor layer 119B includes p-type AlGaN doped with magnesium (Mg) and has a thickness of approximately 30 nm. Each of first p-type semiconductor layer 119A and second p-type semiconductor layer 119B forms a pn junction with second semiconductor layer 115. In this way, when, for example, a voltage between first ohmic electrode 116A and first gate electrode 118A is equal to or smaller than 0 V, a depletion layer expands in the channel region from the first p-type semiconductor layer 119A, and thus it is possible to prevent current from flowing in the channel. Likewise, when, for example, the voltage between second ohmic electrode 116B and second gate electrode 118B is equal to or smaller than 0 V, a depletion layer expands in the channel region from the second p-type semiconductor layer 119B, and thus it is possible to prevent current from flowing in the channel. Accordingly, it is possible to achieve semiconductor element 101 that performs a normally-off operation.

(Regarding Current that Flows in Terminals S1 and S2)

Controller 102 includes first power supply 121 connected between terminal S1 and terminal G1, and second power supply 122 connected between terminal S2 and terminal G2. First power supply 121 and second power supply 122 in this embodiment are variable power supplies. It is to be noted that first power supply 121 and second power supply 122 may be gate circuits or the like to which power supplies are connected instead of variable power supplies.

The voltage of first power supply 121 is set to be lower than a threshold voltage for first gate electrode 118A so that a depletion layer expands below first gate electrode 118A. In addition, the voltage of second power supply 122 is set to be lower than a threshold voltage for second gate electrode 118B so that a depletion layer expands below second gate electrode 118B. In this way, no current flows between terminal S1 that is first ohmic electrode 116A and terminal S2 that is second ohmic electrode 116B in any direction. It is possible to cause bidirectional current flow between terminal S1 and terminal S2 by setting the voltage of first power supply 121 to be higher than or equal to the threshold voltage for first gate electrode 118A and setting the voltage of second power supply 122 to be higher than or equal to the threshold voltage for second gate electrode 118B. When the voltage of first power supply 121 is set to be higher than or equal to the threshold voltage for first gate electrode 118A and the voltage of second power supply 122 is set to be lower than the threshold voltage for second gate electrode 118B, no current flows from terminal S1 to terminal S2 but current flows from terminal S2 to terminal S1. When the voltage of first power supply 121 is set to be lower than the threshold voltage for first gate electrode 118A and the voltage of second power supply 122 is set to be higher than or equal to the threshold voltage for first gate electrode 118A, current flows from terminal S1 to terminal S2 but no current flows from terminal S2 to terminal S1.

Here, when a voltage is applied to terminal G1 and terminal G2 to turn on semiconductor element 101 in the case where the potential of terminal S2 is higher than the potential of terminal S1 in semiconductor element 101, substrate terminal SUB may have a potential lower than that of terminal S1.

In view of this, as illustrated in FIG. 1, it is possible to increase the potential of substrate terminal SUB by short-circuiting (turning on) both first switch element 131 and second switch element 132. At this time, since semiconductor element 101 is also shirt-circuited, the potential of terminal S2 is approximately equal to the potential of terminal S1, and the potential of substrate terminal SUB is also approximately equal to the potentials of terminal S2 and terminal S1. In this way, even when the potential of substrate terminal SUB is lower than the potentials of terminal S1 and terminal S2, a given potential corresponding to the potential of substrate 111 can be defined, which enables stable operation of bidirectional switch 100.

(Example of Specific Circuit Configuration of Substrate Potential Stabilizer 103)

Figure 3:
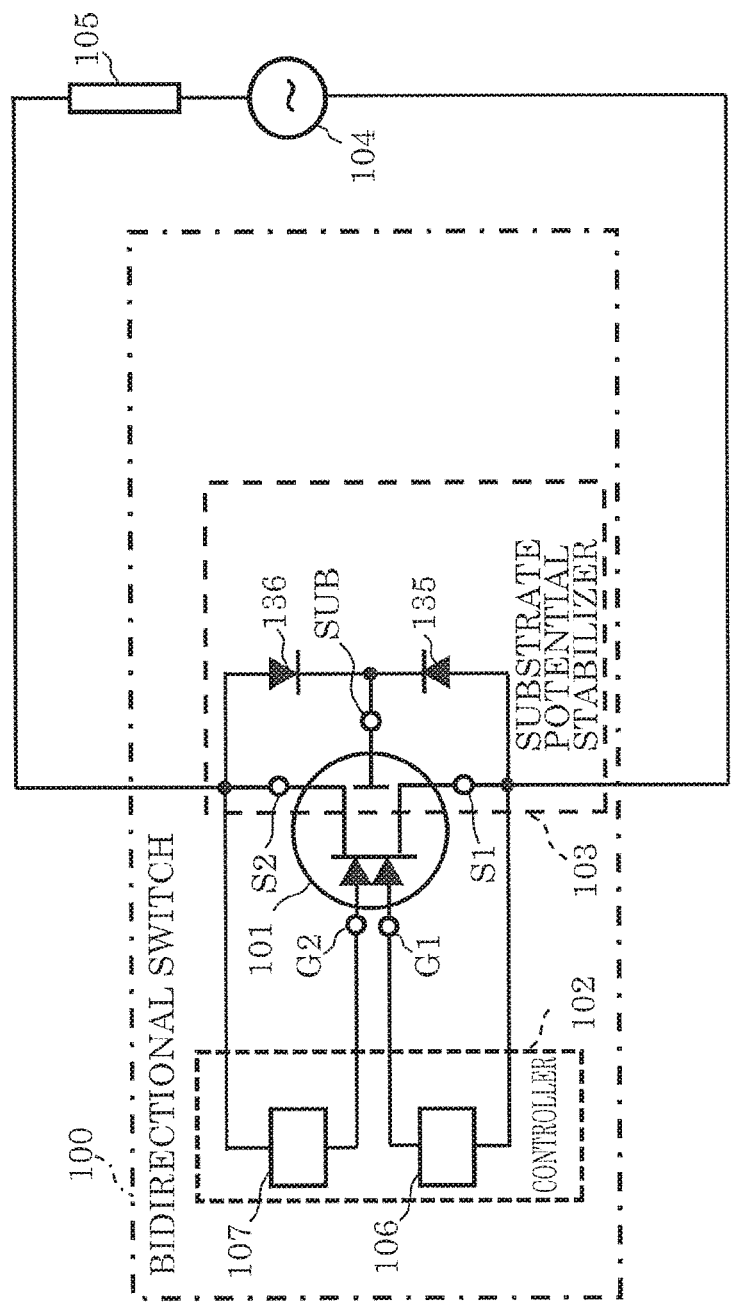
FIG. 3 is a diagram indicating a more specific example of a circuit of the bidirectional switch, the load, and the power supply.

FIG. 3 is a diagram illustrating a more specific example of a circuit of bidirectional switch 100, a load, and a power supply. Unlike FIG. 1, FIG. 3 illustrates first diode 135 and second diode 136 instead of first switch element 131 and second switch element 132, respectively. The differences are mainly described below. As illustrated in FIG. 3, substrate potential stabilizer 103 includes first diode 135 and second diode 136 instead of first switch element 131 and second switch element 132, respectively. First diode 135 is connected between substrate terminal SUB and terminal S1 so that current flows from terminal S1 to substrate terminal SUB in a forward direction. Second diode 136 is connected between substrate terminal SUB and terminal S2 so that current flows from terminal S2 to substrate terminal SUB in a forward direction. It is assumed that first diode 135 and second diode 136 are sufficiently resistive to voltage to be applied to semiconductor element 101.

When a coil or a resistor is connected to semiconductor element 101 to switch on and off semiconductor element 101, as described with reference to FIGS. 15 and 16, the potential of substrate 111 is lower than the potentials of first ohmic electrode 116A and second ohmic electrode 116B. In a compared technique illustrated in FIG. 14, in a configuration in which the anodes of diodes D1 and D2 are connected to substrate terminal SUB, the potentials of the anodes of diodes D1 and D2 are lower than the potentials of the cathodes thereof. In this case, the diodes are conductive (turned on), and thus the substrate potential is not stabilized. In view of this, substrate potential stabilizer 103 in FIG. 3 solves the problem.

Hereinafter, operations performed by substrate potential stabilizer 103 in FIG. 3 are described. A case where the potential of terminal S2 is higher than the potential of terminal S1 is described.

When semiconductor element 101 turns off, the potential of terminal S2 increases, and thus the potential of terminal S2 with respect to the potential of substrate terminal SUB increases. When the difference between potentials of terminal S2 and substrate terminal SUB reaches or exceeds a forward rise voltage of second diode 136, second diode 136 turns on, and the potential of substrate terminal SUB is stabilized at a potential that is lower than the potential of terminal S2 by the amount corresponding to the forward rise voltage.

When semiconductor element 101 turns on, the potential of terminal S2 becomes closer to the potential of terminal S1, and thus the potential of terminal S2 with respect to the potential of substrate terminal SUB decreases. Thus, discharge current flows to a parasitic capacitor between substrate terminal SUB and terminal S2. At this time, the potential of substrate terminal SUB decreases, and the voltage is divided into the parasitic capacitor between substrate terminal SUB and terminal S2 and a parasitic capacitor between substrate terminal SUB and terminal S1. When the potential of substrate terminal SUB is lower than the potential of terminal S1 by the forward rise voltage of first diode 135, first diode 135 turns on, and the potential of substrate terminal SUB is stabilized at a potential lower than the potential of terminal S1 by the amount corresponding to the forward rise voltage. Conventionally, there is no path for controlling a potential when substrate SUB has a potential lower than that of terminal S1. However, first diode 135 is capable of stabilizing a substrate potential.

When the potential of terminal S1 is higher than the potential of terminal S2, the functions of first diode 135 and second diode 136 are inversed.

When semiconductor element 101 turns off, the potential of terminal S1 increases, and thus the potential of terminal S1 with respect to the potential of substrate terminal SUB increases. When the difference between the potentials of terminal S1 and substrate terminal SUB is higher than or equal to the forward rise voltage of first diode 135, first diode 135 turns on to make the potential of substrate terminal SUB approximately equal to the potential of terminal S1.

When semiconductor element 101 turns on, the potential of terminal S1 becomes closer to the potential of terminal S2, and thus the potential of terminal S1 with respect to the potential of substrate terminal SUB decreases. Thus, discharge current flows to a parasitic capacitor between substrate terminal SUB and terminal S1. At this time, the potential of substrate terminal SUB decreases. When the potential of substrate terminal SUB decreases below the potential of terminal S2 by the forward rise voltage of second diode 136, second diode 136 turns on to make the potential of substrate terminal SU 1 equal to the potential of terminal S2.

In this way, second diode 136 is capable of stabilizing the substrate potential in FIG. 3 according to this embodiment.

As described above, bidirectional switch 100 according to Embodiment 1 includes semiconductor element 101 and substrate potential stabilizer 103. Semiconductor element 101 includes: substrate 111; a semiconductor stack formed above a first surface of substrate 111; first ohmic electrode 116A and second ohmic electrode 1161B formed on the semiconductor stack to be spaced apart from each other; first gate electrode 118A and second gate electrode 118B formed between first ohmic electrode 116A and second ohmic electrode 116B sequentially from the side of first ohmic electrode 116A; and rear surface electrode 153 formed on a second surface of substrate 111 opposite to the first surface above which the semiconductor stack is formed. Substrate potential stabilizer 103 includes: first switch element 131 which connects first ohmic electrode 116A and rear surface electrode 153; and second switch element 132 which connects second ohmic electrode 116B and rear surface electrode 153. When semiconductor element 101 is on, both first switch element 131 and second switch element 132 are conductive.

In this way, substrate potential stabilizer 103 eliminates the possibility that the potential of the substrate is unstable. Thus, it is possible to implement bidirectional switch 100 which operates stably. For example, even when an inductive load including a coil or the like is connected, it is possible to stabilize switch operations by preventing a substrate potential from changing to a negative voltage when bidirectional switch 100 is on. When semiconductor element 101 is on, both first switch element 131 and second switch element 132 are conductive. Thus, electric power loss can be reduced.

In addition, in another embodiment of bidirectional switch 100 according to Embodiment 1, substrate potential stabilizer 103 includes: first diode 135 which connects first ohmic electrode 116A and rear surface electrode 153; and second diode 136 which connects second ohmic electrode 116B and rear surface electrode 153. The cathode of first diode 135 is connected to rear surface electrode 153, and the anode of first diode 135 is connected to first ohmic electrode 116A. The cathode of second diode 136 is connected to rear surface electrode 153, and the anode of second diode 136 is connected to second ohmic electrode 116B.

In this way, at least one of first diode 135 and second diode 136 is on when the potential of rear surface electrode 153 is lower than one of the potential of first ohmic electrode 116A and the potential of second ohmic electrode 116B. This makes it possible to increase a substrate potential to the potential that is lower by the amount corresponding to one of a forward voltage of first diode 135 and a forward voltage of second diode 136.

Here, the semiconductor stack, first switch 131, and second switch element 132 may include a nitride semiconductor.

In this way, both semiconductor element 101 and substrate potential stabilizer 103 can be formed on a substrate, which makes it easier to reduce wiring inductance between substrate potential stabilizer 103 and rear surface electrode 153. In this way, it is possible to quickly stabilize the substrate potential.

Embodiment 2

Bidirectional switch 100 according to Embodiment 2 is described with reference to the drawings. It is to be noted that, in Embodiment 2 and the following other embodiments, substantially the same portions as in FIGS. 2 and 3 are assigned the same reference numerals and are not repeatedly described.

(Example of Circuit Configuration of Bidirectional Switch)

Figure 4:
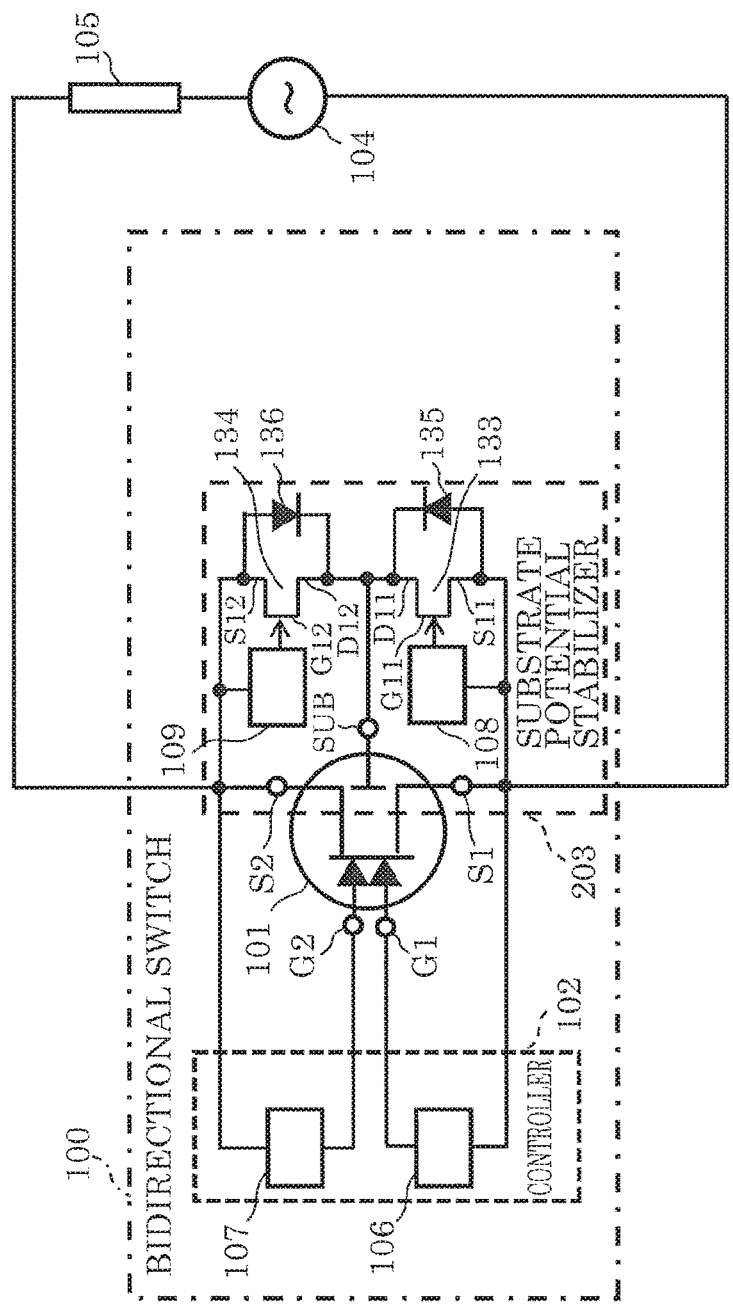
FIG. 4 is a diagram illustrating an example of a circuit configuration indicating a bidirectional switch according to Embodiment 2, a load, and a power supply.

FIG. 4 is a diagram illustrating an example of a circuit configuration indicating bidirectional switch 100 according to this embodiment, load 105, and power supply 104. Unlike bidirectional switch 100 in FIG. 3, bidirectional switch 100 in FIG. 4 includes substrate potential stabilizer 203 instead of substrate potential stabilizer 103. The differences are mainly described below.

As illustrated in FIG. 4, substrate potential stabilizer 203 includes: first transistor 133; second transistor 134; first diode 135; second diode 136; third gate control circuit 108; and fourth gate control circuit 109. First transistor 133 and first diode 135 are connected between substrate terminal SUB and terminal S1. Second transistor 134 and second diode 136 are connected between substrate terminal SUB and terminal S2. Drain terminal D11 of first transistor 133 and drain terminal D12 of second transistor 134 are connected to substrate terminal SUB. In addition, gate terminal G11 of first transistor 133 is connected to third gate control circuit 108. Gate terminal G12 of second transistor 134 is connected to fourth gate control circuit 109. In addition, source terminal S11 of first transistor 133 is connected to terminal S1. Source terminal S12 of second transistor 134 is connected to terminal S2. Source terminal S11 of first transistor 133 and the anode of first diode 135 are connected to each other. Drain terminal D11 of first transistor 133 and the cathode of first diode 135 are connected to each other. In addition, source terminal S12 of second transistor 134 and the anode of second diode 136 are connected to each other. Drain terminal D12 of second transistor 134 and the cathode of second diode 136 are connected to each other.

It is to be noted that, when each of first transistor 133 and second transistor 134 has a body diode, there is no need to separately provide first diode 135 and second diode 136.

Hereinafter, operations performed by substrate potential stabilizer 203 in FIG. 4 are described. A case where the potential of terminal S2 is higher than that of terminal S1 is described.

When semiconductor element 101 is turned off, the potential of terminal S2 increases, and thus the potential of terminal S2 with respect to the potential of substrate terminal SUB increases. When the difference between potentials of terminal S2 and substrate terminal SUB reaches or exceeds a forward rise voltage of second diode 136, second diode 136 turns on, and the potential of substrate terminal SUB is stabilized at a potential that is lower than the potential of terminal S2 by the amount corresponding to the forward rise voltage. Furthermore, since it is possible to short-circuit substrate terminal SUB and terminal S2 by turning on second transistor 134, it is possible to stabilize the potentials of substrate terminal SUB and terminal S2 at approximately equal potentials.

When semiconductor element 101 turns on, the potential of terminal S2 becomes closer to the potential of terminal S1, and thus the potential of terminal S2 with respect to the potential of substrate terminal SUB decreases. Thus, discharge current flows to a parasitic capacitor between substrate terminal SUB and terminal S2. At that time, the potential of substrate terminal SUB decreases. When the potential of substrate terminal SUB is lower than the potential of terminal S1 by the amount corresponding to the forward rise voltage of first diode 135, first diode 135 turns on, and the potential of substrate terminal SUB is stabilized at a potential lower than the potential of terminal S1 by the amount corresponding to the forward rise voltage. Furthermore, since it is possible to short-circuit substrate terminal SUB and terminal S1 by turning on first transistor 133, it is possible to stabilize the potentials of substrate terminal SUB and terminal S1 at approximately equal potentials.

(Timing Charts)

Figure 5:
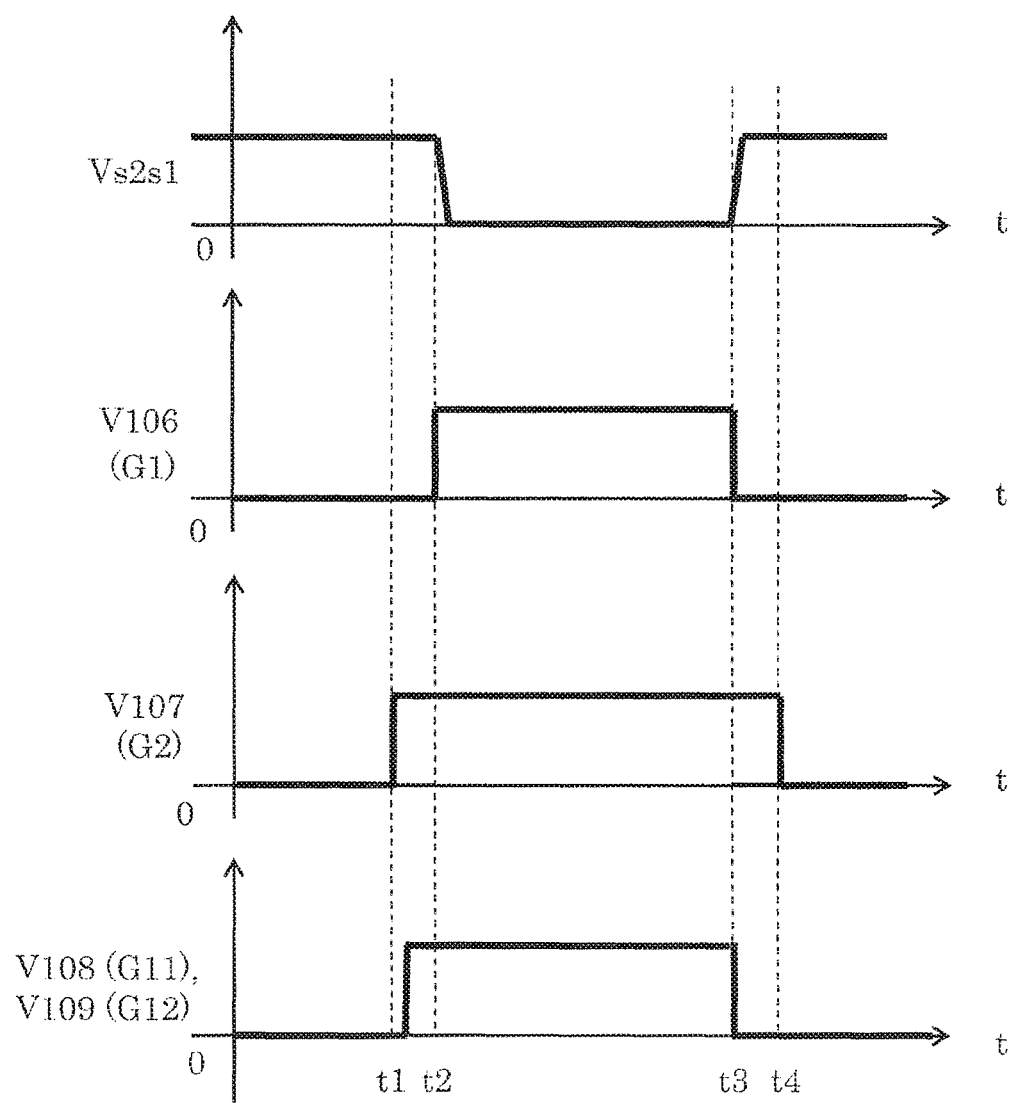
FIG. 5 is a diagram indicating timing charts in examples of operations performed by the bidirectional switch.

FIG. 5 is a diagram indicating timing charts in examples of operations performed by bidirectional switch 100.

In FIG. 5, signal Vs2s1 indicates a potential of terminal S2 with respect to the potential of terminal S1. In other words, the potential of terminal S2 with respect to the potential of terminal S1 is denoted as Vs2s1. Signal V106 (G1) is a signal supplied from first gate control circuit 106 to terminal G1. Signal V107 (G2) is a signal supplied from second gate control circuit 107 to terminal G2. Signal V108 (G11) is a signal supplied from third gate control circuit 108 to gate terminal G11. Signal V109 (G12) is a signal supplied from fourth gate control circuit 109 to gate terminal G12. It is to be noted that each of differences in levels in the timing charts in FIG. 5 indicates a change in signal voltage at a certain point of time. It is to be noted that time t1, t2, t3, and t4 are, for example, approximately 20 μseconds, approximately 30 μseconds, approximately 70 μseconds, and approximately 80 μseconds, respectively, with respect to time 0 (second). In FIG. 5, each of broken lines indicate a point of time.

FIG. 5 indicates that the potential of terminal S2 until time t2 is higher than the potential of terminal S1. At least before the time when first gate control circuit 106 turns on terminal G1, third gate control circuit 108 and fourth gate control circuit 109 turn on first transistor 133 and second transistor 134, respectively. Thus, it is possible to quickly stabilize the potential of substrate terminal SUB.

A case where the potential of terminal S2 is higher than that of terminal S1 is specifically described. At time t1, signal V107 for turning on a gate is output from second gate control circuit 107. In a period from time t1 to time t2, third gate control circuit 108 and fourth gate control circuit 109 output turn-on signals V108 and V109, respectively. At time t2, turn-on signal V106 is output from first gate control circuit 106, and when semiconductor element 101 turns on, the potential of terminal S2 becomes closer to the potential of substrate terminal SUB. At this time, the parasitic capacitor between rear surface electrode 153 and first ohmic electrode 116A is discharged. This current flows from the drain terminal to the source terminal of each of first transistor 133 and second transistor 134, which short-circuits terminal S1, terminal S2, and substrate terminal SUB. Thus, the potentials of terminal S2 and substrate terminal SUB become approximately equal to the potential of terminal S1, which stabilizes the potential of substrate terminal SUB. Likewise, when the potential of terminal S1 is higher than the potential of terminal S2, the potential of substrate terminal SUB follows the potential of terminal S1 and becomes equal to the potential of terminal S2.

At time t3, a turn-off signal is output from first gate control circuit 106, and at time t4, a turn-off signal is output from second gate control circuit 107 to turn off semiconductor element 101. At this time, the potential of terminal S2 with respect to the potential of substrate terminal increases to supply current to second diode 136. In FIG. 5, third gate control circuit 108 and fourth gate control circuit 109 each output a turn-off signal when semiconductor element 101 turns off. However, third gate control circuit 108 and fourth gate control circuit 109 each may output a turn-on signal instead. In such a case, current flows not only from second diode 136 but also from the source terminal of second transistor 134. This current charges the parasitic capacitor between rear surface electrode 153 and first ohmic electrode 116A. Accordingly, the potential of substrate terminal SUB is approximately the same potential as the potential of terminal S2 and transits similarly to the potential of terminal S2.

As illustrated in FIG. 5, both first transistor 133 and second transistor 134 are conductive when semiconductor element 101 is on.

It is to be noted that the values of time t1, t2, t3, and t4 are non-limiting examples.

As explained above, bidirectional switch 100 according to Embodiment 2 may be configured in such a manner that: first switch element 131 is replaced by first transistor 133 and second switch element 132 is replaced by second transistor 134; first transistor 133 includes (i) third ohmic electrode 116C, (ii) fourth ohmic electrode 116D, and (iii) third gate electrode 118C formed between third ohmic electrode 116C and fourth ohmic electrode 116D; second transistor 134 includes (i) fifth ohmic electrode 116E, (ii) sixth ohmic electrode 116F, and (iii) fourth gate electrode 118D formed between fifth ohmic electrode 116E and sixth ohmic electrode 116F; third ohmic electrode 116C and first ohmic electrode 116A are connected to each other; fourth ohmic electrode 116D and rear surface electrode 153 are connected to each other; fifth ohmic electrode 116E and second ohmic electrode 116B are connected to each other; and sixth ohmic electrode 116F and rear surface electrode 153 are connected to each other.

In this way, when the potential of rear surface electrode 153 is lower than one of the potential of first ohmic electrode 116A and the potential of second ohmic electrode 116B, it is possible to increase and stabilize a substrate potential by turning on first transistor 133 and second transistor 134.

Here, in first transistor 133, third ohmic electrode 116C may be a source electrode (corresponding to source terminal S11), and fourth ohmic electrode 116D is a drain electrode (corresponding to drain terminal D11). Likewise, in second transistor 134, fifth ohmic electrode 116E may be a source electrode (corresponding to source terminal S12), and sixth ohmic electrode 116F is a drain electrode (corresponding to drain terminal D12).

When a body diode is formed in each of first transistor 133 and second transistor 134, rear surface electrode 153 corresponds to a cathode. Thus, the diode is conductive when the potential of rear surface electrode 153 is lower than one of the potential of first ohmic electrode 116a and the potential of second ohmic electrode 116B. Accordingly, it is possible to increase the substrate potential to the potential that is lower than the one of the potential of first ohmic electrode 116a and the potential of second ohmic electrode 116B by the amount corresponding to a forward voltage of the diode and stabilize the increased substrate potential.

Here, a turn-on voltage may be applied to third gate electrode 118C before being applied to first gate electrode 118A when the potential of second ohmic electrode 116b is higher than the potential of first ohmic electrode 116A, and a turn-on voltage may be applied to fourth gate electrode 118D before being applied to second gate electrode 118B when the potential of first ohmic electrode 116A is higher than the potential of second ohmic electrode 116B. In other words, the turn-on voltage is applied to gate terminal G11 before being applied to terminal G1 when the potential of terminal S2 is higher than the potential of terminal S1, and the turn-on voltage is applied to gate terminal G12 before being applied to terminal G2 when the potential of terminal S1 is higher than the potential of terminal S2.

In this case, it is possible to cause, in advance, rear surface electrode 153 to be conductive with one of first ohmic electrode 116A and second ohmic electrode 116B which has a potential lower than the potential of the other before semiconductor element 101 turns on. This enables reduction in bidirectional variation of substrate potential. Accordingly, it is possible to implement bidirectional switch 100 which operates stably.

Embodiment 3

Next, bidirectional switch 100 according to Embodiment 3 is described with reference to the drawings.
(Example of Circuit Configuration of Bidirectional Switch)

Figure 6:
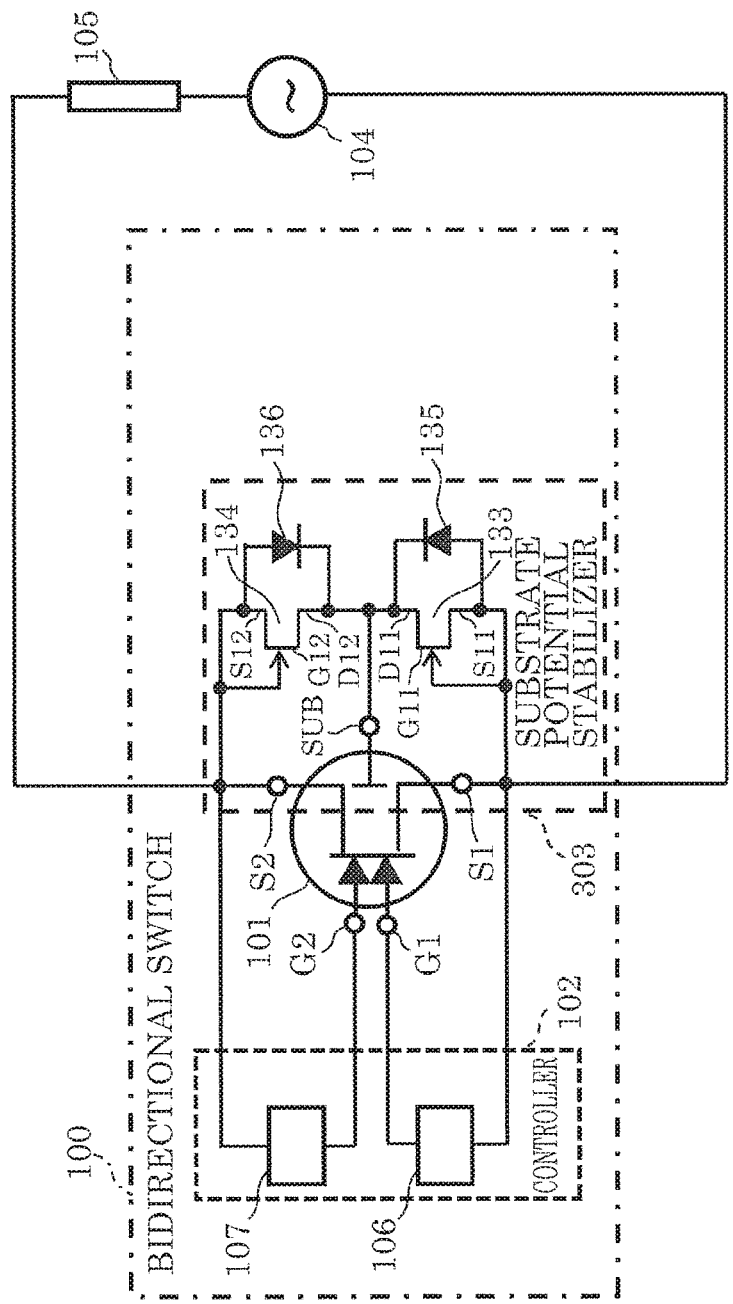
FIG. 6 is a diagram illustrating an example of a circuit configuration indicating a bidirectional switch according to Embodiment 3, a load, and a power supply.

FIG. 6 is a diagram illustrating an example of a circuit configuration indicating bidirectional switch 100 according to this embodiment, load 105, and power supply 104. Unlike bidirectional switch 100 in FIG. 3, bidirectional switch 100 in FIG. 6 includes substrate potential stabilizer 303 instead of substrate potential stabilizer 103. The differences are mainly described below.

Substrate potential stabilizer 303 in FIG. 6 includes: first transistor 133; second transistor 134; first diode 135; and second diode 136. As illustrated in FIG. 6, gate terminal G11 and source terminal S11 of first transistor 133 are short-circuited and connected to terminal S1. Gate terminal G12 and source terminal S12 of second transistor 134 are short-circuited and connected to terminal S2. In addition, drain terminal D11 of first transistor 133 and drain terminal D12 of second transistor 134 are connected to each other and also connected to substrate terminal SUB. In addition, source terminal S11 of first transistor 133 is connected to terminal S1. Source terminal S12 of second transistor 134 is connected to terminal S2. Source terminal S11 of first transistor 133 and the anode of first diode 135 are connected to each other, and drain terminal D11 of first transistor 133 and the cathode of first diode 135 are connected to each other. In addition, source terminal S12 of second transistor 134 and the anode of second diode 136 are connected to each other. Drain terminal D12 of second transistor 134 and the cathode of second diode 136 are connected to each other.
(Cross Sectional Configurations of First Transistor 133 and Second Transistor 134)

Figure 7:
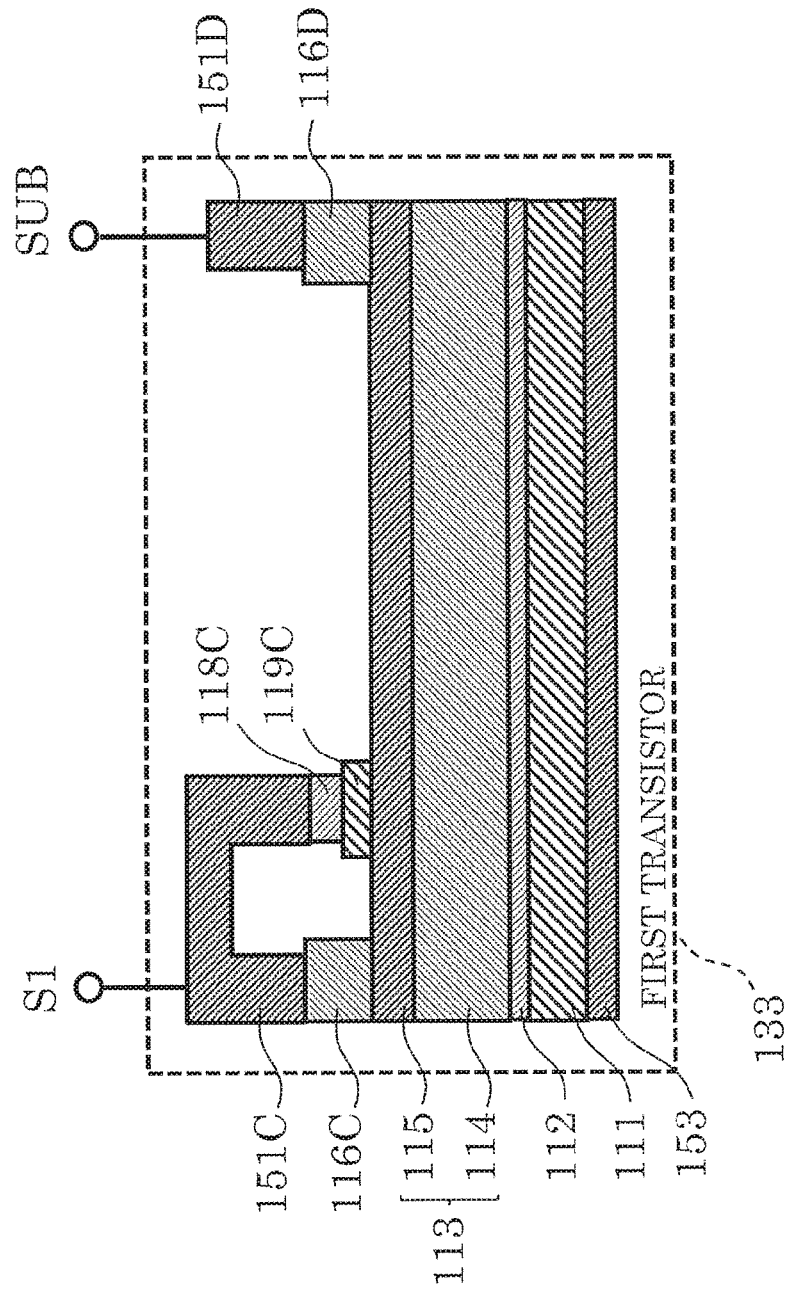
FIG. 7 is a cross sectional view of an example of a configuration of a first transistor.
Figure 8:
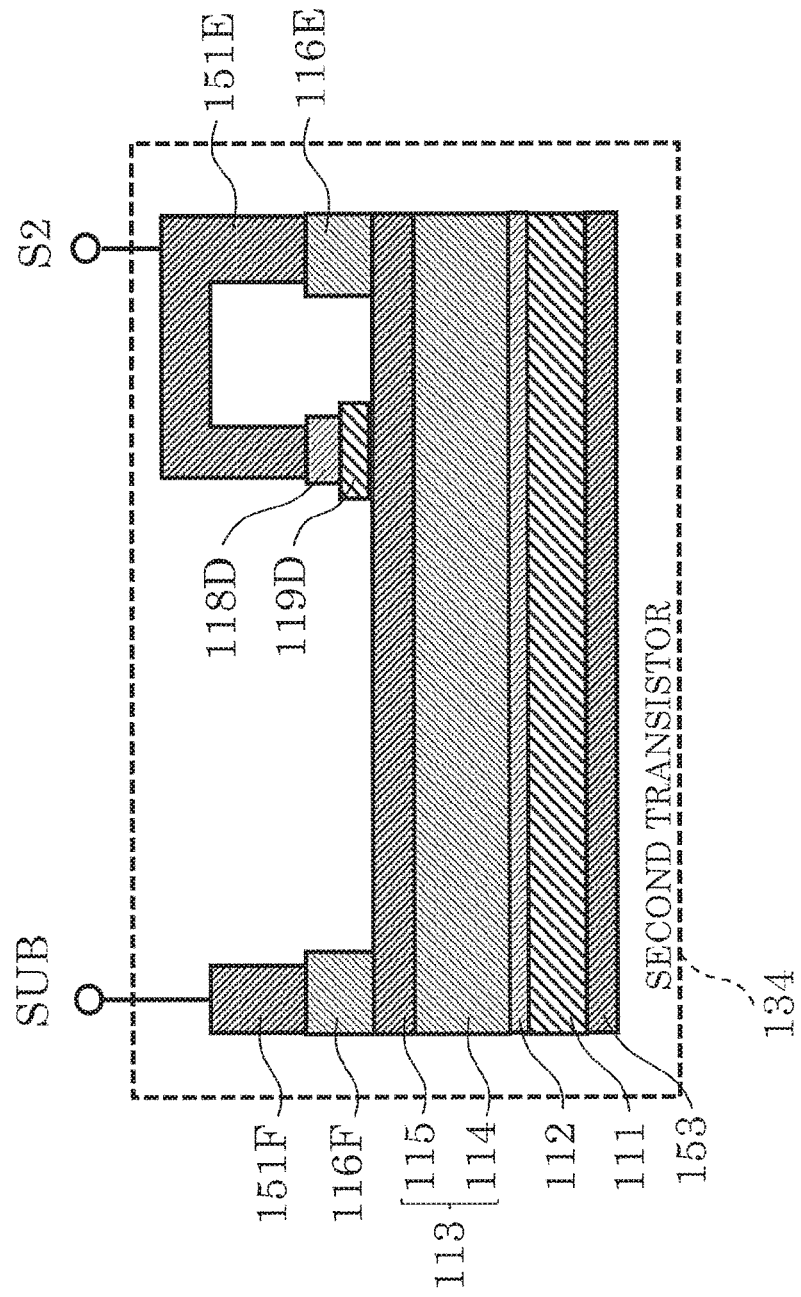
FIG. 8 is a cross sectional view of an example of a configuration of a second transistor.

FIGS. 7 and 8 are cross sectional views of examples of configurations of first transistor 133 and second transistor 134. Likewise semiconductor element 101 illustrated in FIG. 2, both first transistor 133 and second transistor 134 are formed on substrate 111. It is to be noted that, in this embodiment, substantially the same portions as in FIG. 2 are assigned the same reference numerals and are not repeatedly described.

In FIG. 7, third ohmic electrode 116C and fourth ohmic electrode 116D are formed on nitride semiconductor layer 113 to be spaced apart from each other. Electrode wiring 151C is formed on third ohmic electrode 116C. Third ohmic electrode 116C, third gate electrode 118C, and terminal S1 are electrically connected via electrode wiring 151C. Third p-type semiconductor layer 119C is formed below third gate electrode 118C. Third p-type semiconductor layer 119C is doped with Mg that is sufficient to change a 2DEG layer of second semiconductor layer 115 to a depletion layer. Electrode wiring 151D is formed on fourth ohmic electrode 116D. Fourth ohmic electrode 116D and substrate terminal SUB are electrically connected.

When a voltage higher than or equal to a voltage obtainable by adding a threshold voltage for third gate electrode 118C to a voltage corresponding to the potential of substrate terminal SUB is applied to terminal S1, a 2DEG layer is formed below third p-type semiconductor layer 119C, and current flows from third ohmic electrode 116C to fourth ohmic electrode 116D. The current flows in the direction in which forward current of first diode 135 flows. First transistor 133 can function as a diode.

Second transistor 134 illustrated in FIG. 8 has almost the same configuration as that of first transistor 133 illustrated in FIG. 7. Likewise second transistor 134 illustrated in FIG. 8, when a voltage higher than or equal to a voltage corresponding to the potential of substrate terminal SUB by a threshold voltage for fourth gate electrode 118D is applied to terminal S2, a 2DEG layer is formed below fourth p-type semiconductor layer 119D, and current flows from fifth ohmic electrode 116E to sixth ohmic electrode 116F. The current flows in the direction in which forward current of second diode 136 flows. Second transistor 134 can function as a diode.

As described above, bidirectional switch 100 according to Embodiment 3 includes semiconductor element 101 and substrate potential stabilizer 303.

Semiconductor element 101 includes: substrate 111; a semiconductor stack formed above a first surface of substrate 111; first ohmic electrode 116A and second ohmic electrode 116B formed on the semiconductor stack to be spaced apart from each other; first gate electrode 118A and second gate electrode 118B formed between first ohmic electrode 116A and second ohmic electrode 116B sequentially from the side of first ohmic electrode 116A; and rear surface electrode 153 formed on a second surface of substrate 111 opposite to the first surface above which the semiconductor stack is formed.

Substrate potential stabilizer 303 includes: first transistor 133 which connects first ohmic electrode 116A and rear surface electrode 153; and second transistor 134 which connects second ohmic electrode 116B and rear surface electrode 153.

First transistor 133 includes: a first source electrode (corresponding to source terminal S11); a first drain electrode (corresponding to drain terminal D11); and third gate electrode 118C (corresponding to gate terminal G1) formed between the first source electrode and the first drain electrode.

Second transistor 134 includes: a second source electrode (corresponding to source terminal S12); a second drain electrode (corresponding to drain terminal D12); and fourth gate electrode 118D (corresponding to gate terminal G12) formed between second source electrode and second drain electrode.

A first source electrode (corresponding to source terminal S11) is connected to first ohmic electrode 116A, a first drain electrode (corresponding to drain terminal D11) is connected to rear surface electrode 153, a second drain electrode (corresponding to drain terminal D12) is connected to rear surface electrode 153, and a second source electrode (corresponding to source terminal S12) is connected to second ohmic electrode 116B.

Substrate potential stabilizer 303 includes p-type semiconductor layers 119C and 119D formed between a semiconductor stack and respective third gate electrode 118C and fourth gate electrode 118D.

Third gate electrode 118C (corresponding to gate terminal G11) is connected to a first source electrode (corresponding to source terminal S11). Fourth gate electrode 118D (corresponding to gate terminal G12) is connected to a second source electrode (corresponding to source terminal S12).

With this configuration, first transistor 133 and second transistor 134 can be regarded as diodes each having a cathode connected to rear surface electrode 153. The diode is conductive when the potential of rear surface electrode 153 is lower than one of the potential of first ohmic electrode 116A and the potential of second ohmic electrode 116B. Accordingly, it is possible to increase the substrate potential to a substrate potential that is lower than the one of the potential of first ohmic electrode 116A and the potential of second ohmic electrode 116B by the amount corresponding to the forward voltage of the diode, and stabilize the increased substrate potential.

In addition, since it is possible to form, as the diodes, both first transistor 133 and second transistor 134 on substrate 111 on which semiconductor element 101 is formed, it is possible to reduce inductance between semiconductor element 101 and substrate potential stabilizer 303. Accordingly, it is possible to cause substrate potential stabilizer 303 to operate fast. In addition, by causing first transistor 133 and second transistor 134 to function as the diodes as described above, it is possible to reduce backward leak current so as to reduce loss significantly than in the case where a Schottky diode made of nickel (Ni) or the like is formed on substrate 111.

Embodiment 4

Next, bidirectional switch 100 according to Embodiment 4 is described with reference to the drawings.
(Circuit Configuration of Bidirectional Switch)

Figure 9:
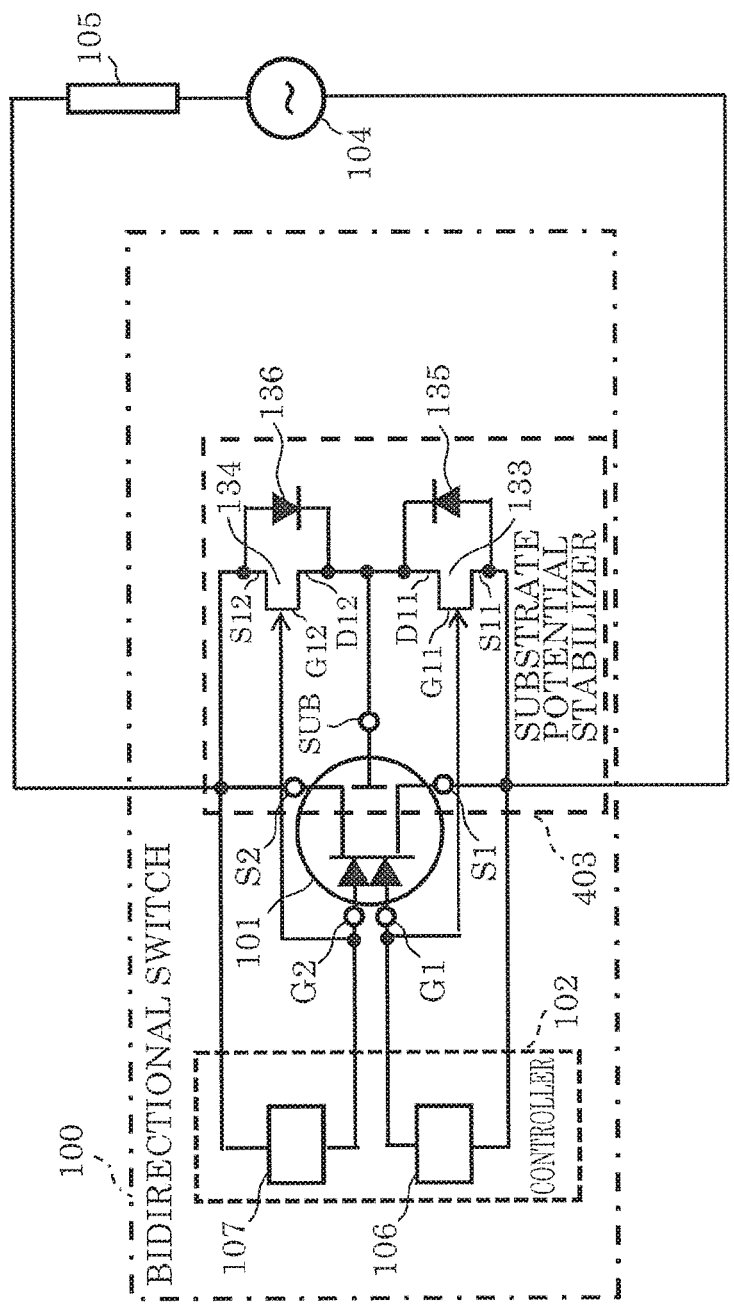
FIG. 9 is a diagram illustrating an example of a circuit configuration indicating a bidirectional switch according to Embodiment 4, a load, and a power supply.

FIG. 9 is a diagram illustrating an example of a circuit configuration indicating bidirectional switch 100 according to this embodiment, load 105, and power supply 104. Unlike bidirectional switch 100 in FIG. 6, bidirectional switch 100 in FIG. 9 includes substrate potential stabilizer 403 instead of substrate potential stabilizer 303. The differences are mainly described below.

As illustrated in FIG. 9, substrate potential stabilizer 403 includes: first transistor 133; second transistor 134; first diode 135; and second diode 136. As illustrated in FIG. 9, gate terminal G11 of first transistor 144 is connected to terminal G1. Gate terminal G12 of second transistor 134 is connected to terminal G2. In addition, drain terminal D11 of first transistor 133 and drain terminal D12 of second transistor 134 are connected to each other and also connected to substrate terminal SUB. Source terminal S11 of first transistor 133 and the anode of first diode 135 are connected to each other. Drain terminal D11 of first transistor 133 and the cathode of first diode 135 are connected to each other. In addition, source terminal S12 of second transistor 134 and the anode of second diode 136 are connected to each other. Drain terminal D12 of second transistor 134 and the cathode of second diode 136 are connected to each other.

With this configuration, first transistor 133 and second transistor 134 are turned on when terminal G1 and terminal G2 of semiconductor element 101 turn on. Thus, third gate control circuit 108 and fourth gate control circuit 109 in FIG. 4 are unnecessary, which enables cost reduction.

Likewise Embodiment 2, when the potential of terminal S2 is higher than that of terminal S1, the potential of substrate terminal SUB is approximately equal to the potential of terminal S2 when the gate of semiconductor element 101 turns on. Likewise, when the potential of terminal S11 is higher than that of terminal S2, the potential of substrate terminal SUB is approximately equal to the potential of terminal S1 when the gate of semiconductor element 101 turns on. Thus, it is possible to stabilize the substrate potential.
(Plan-View Configuration of Multi-Fingered Semiconductor Element 101)

Figure 10A:
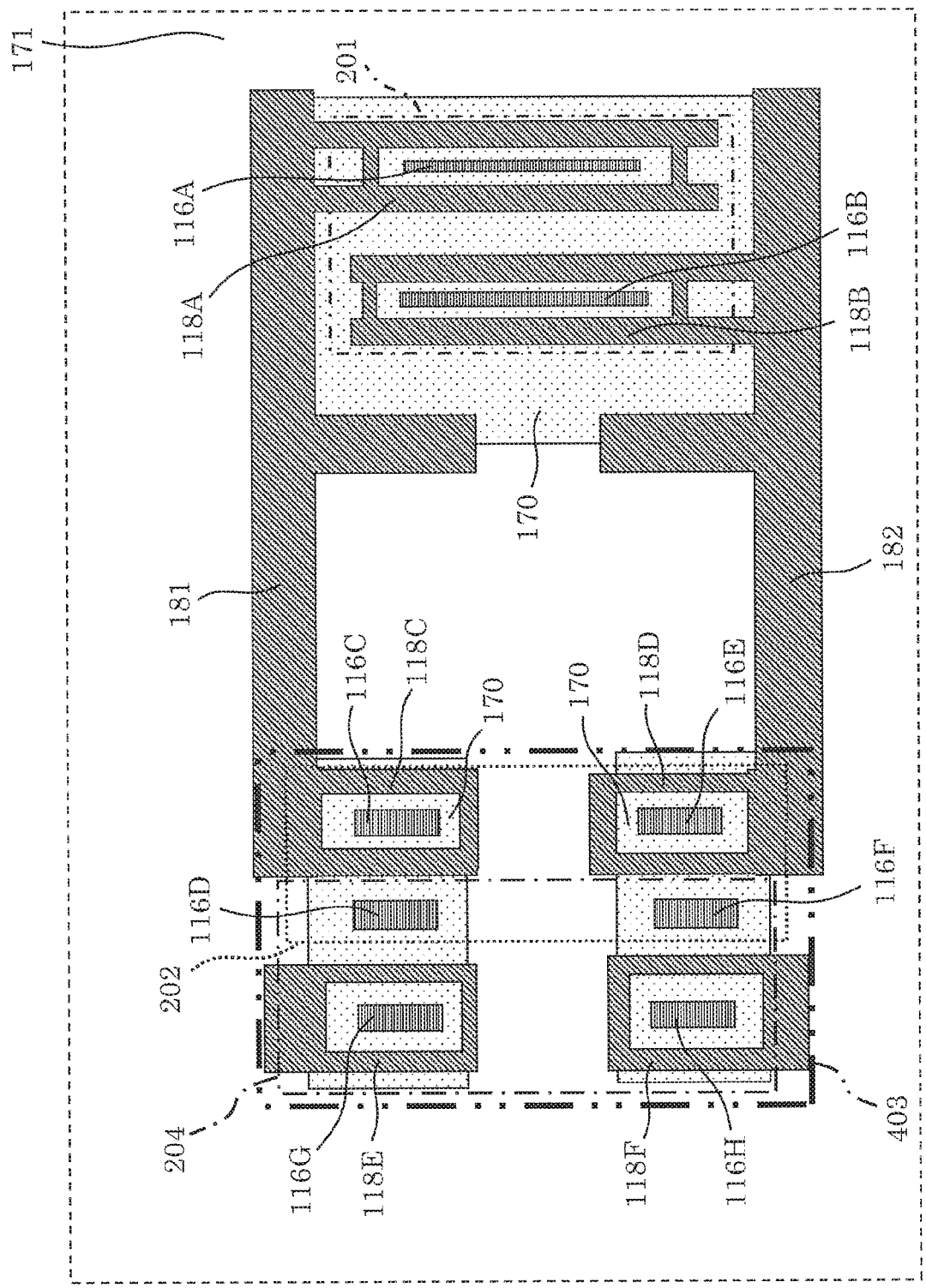
FIG. 10A is a plan view of a wiring layout of a semiconductor element and a substrate potential stabilizer.
Figure 10B:
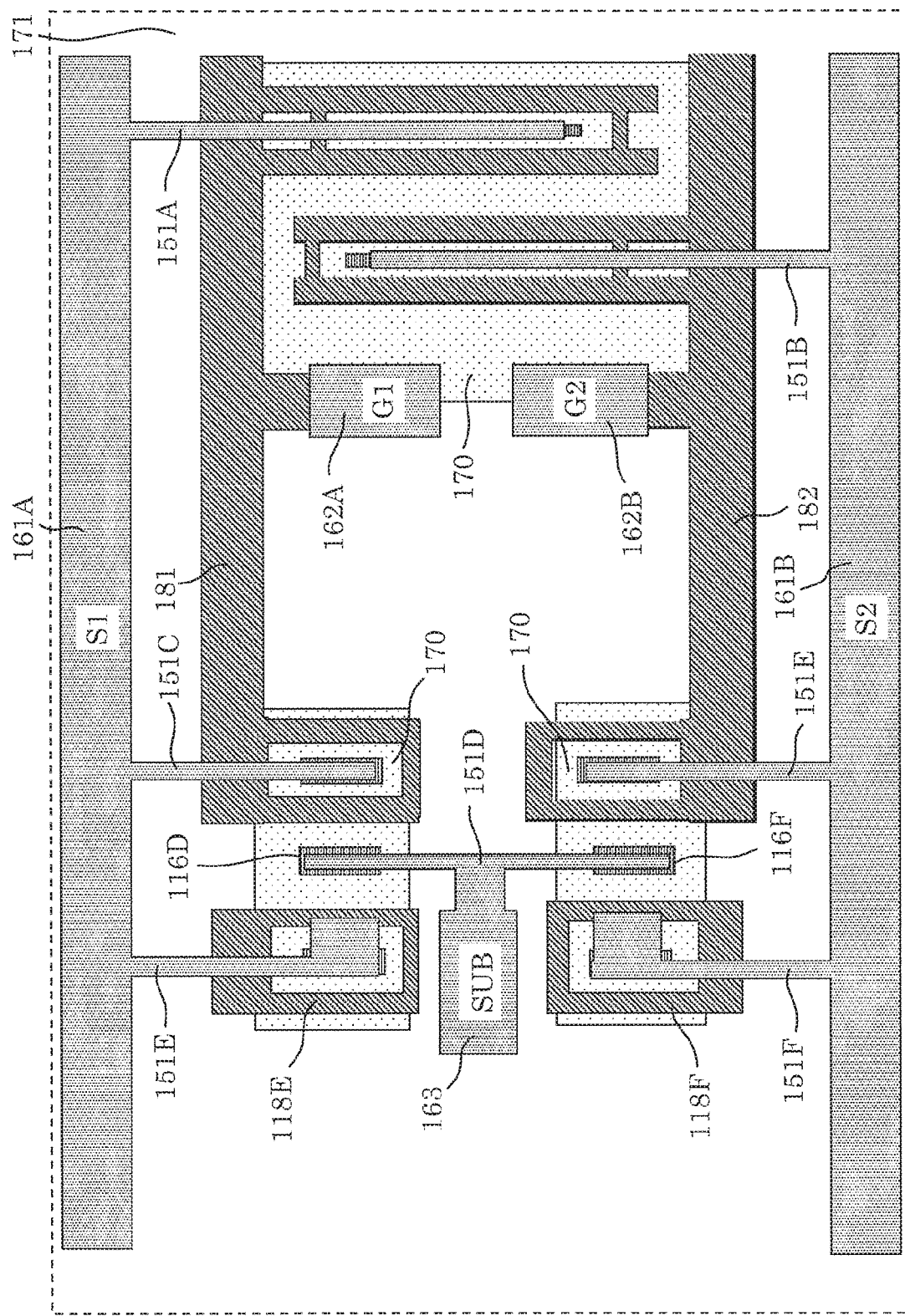
FIG. 10B is a plan view of a wiring layout of a semiconductor element and a substrate potential stabilizer.

Semiconductor element 101 is generally formed as a multi-fingered semiconductor element in order to increase current-carrying capacity. FIGS. 10A and 10B are each a plan view of a wiring layout of multi-fingered semiconductor element 101 and substrate potential stabilizer 403 in a bidirectional switch according to this embodiment. FIG. 10A is a plan view before providing S1 electrode pad 161A, G1 electrode pad 162A, S2 electrode pad 161B, 02 electrode pad 162B, and substrate electrode pad 163 illustrated in FIG. 10B. In addition, FIG. 10 is a plan view after S1 electrode pad 161A, G1 electrode pad 162A, S2 electrode pad 161B, G2 electrode pad 162B, and substrate electrode pad 163 are provided.

Dual gate transistor 201 in FIG. 10A corresponds to semiconductor element 101. Auxiliary transistor unit 202 corresponds to first transistor 133 and second transistor 134 included in substrate potential stabilizer 403. Auxiliary diode unit 204 corresponds to first diode 135 and second diode 136 included in substrate potential stabilizer 403.

As illustrated in FIGS. 10A and 10B, nitride semiconductor layer 113 includes: active region 170 and inactive region 171 surrounding active region 170. Inactive region 171 is a region in which iron (Fe) is dispersed, and has a resistivity higher than the resistivity of the active region. Fe may be dispersed by ion injection.

First ohmic electrode 116A and second ohmic electrode 116B each having a plurality of fingers are formed in active region 170. The fingers of first ohmic electrode 116A and the fingers of second ohmic electrode 116B are formed alternately to be parallel to each other. Fingers of first gate electrode 118A and fingers of second gate electrode 118B are formed in the region between the fingers of first ohmic electrode 116A and the fingers of second ohmic electrode 116B.

In this way, a plurality of dual gate transistors 201 each having the fingers of first ohmic electrode 116A and the fingers of first gate electrode 118A, second gate electrode 118B, and second ohmic electrode 116B are formed.

Dual gate transistors 201 are alternately oriented in opposite directions. Thus, dual gate transistors 201 adjacent to each other share either the fingers of first ohmic electrode 116A or the fingers of second ohmic electrode 116B. The fingers of first gate electrode 118A and the fingers of second gate electrode 118B, which are not illustrated in FIGS. 10A and 10B, are formed above first p-type semiconductor layer 119A and second p-type semiconductor layer 119B, and the cross sectional configuration of each of dual gate transistors 201 is the same as illustrated in FIG. 2.

In addition, third ohmic electrode 116C and fourth ohmic electrode 116D of first transistor 133 and fifth ohmic electrode 116E and sixth ohmic electrode 116F of second transistor 134 are formed in active region 170.

The fingers of third ohmic electrode 116C and the fingers of fourth ohmic electrode 116D are formed to be parallel to each other. Fingers of third gate electrode 118C are formed between the fingers of third ohmic electrode 116C and the fingers of fourth ohmic electrode 116D.

The fingers of fifth ohmic electrode 116E and the fingers of sixth ohmic electrode 116F are formed to be parallel to each other. Fingers of fourth gate electrode 118D are formed between the fingers of fifth ohmic electrode 116E and the fingers of sixth ohmic electrode 116F.

Third ohmic electrode 116C is connected to S1 electrode pad 161A via electrode wiring 151C. Fourth ohmic electrode 116D and sixth ohmic electrode 116F are each connected to substrate electrode pad 163 via electrode wiring 151D. Fifth ohmic electrode 116E is connected to S2 electrode pad 161B via electrode wiring 151E.

Third gate electrode 118C is connected to first gate electrode 118A via first gate wiring 181. In addition, fourth gate electrode 118D is connected to second gate electrode 118B via second gate wiring 182. First gate electrode 118A, second gate electrode 118B, third gate electrode 118C, and fourth gate electrode 118D may be connected using the same electrode material or plated wiring etc.

In this way, auxiliary transistor unit 202 including third ohmic electrode 116C, fourth ohmic electrode 116D, fifth ohmic electrode 116E, sixth ohmic electrode 116F, third gate electrode 118C, and fourth gate electrode 118I) is formed.

It is to be noted that each transistor included in auxiliary transistor unit 202 may be a multi-fingered transistor.

The fingers of third gate electrode 118C and the fingers of fourth gate electrode 118D, which are not illustrated in FIGS. 10A and 10B, are formed above third p-type semiconductor layer 119C and fourth p-type semiconductor layer 119D.

In addition, seventh ohmic electrode 116G, eighth ohmic electrode 116H, fifth gate electrode 118E, and sixth gate electrode 118F are formed in active region 170. Fifth gate electrode 118E is formed to enclose seventh ohmic electrode 116G. Fifth gate electrode 118E is connected to each of seventh ohmic electrode 116G and S1 electrode pad 161A via electrode wiring 151E.

In this way, first diode 135 having fourth ohmic electrode 116D as the cathode is formed.

Sixth gate electrode 118F is formed to enclose eighth ohmic electrode 116H. Sixth gate electrode 118F is connected to each of eighth ohmic electrode 116H and S2 electrode pad 161B via electrode wiring 151F.

In this way, second diode 136 having sixth ohmic electrode 116F as the cathode is formed.

First diode 135 and second diode 136 are included in auxiliary diode unit 204. In this embodiment, auxiliary transistor unit 302 and auxiliary diode unit 204 share fourth ohmic electrode 116D and sixth ohmic electrode 116F, which contributes to space saving.

As described above, in bidirectional switch 100 according to Embodiment 4, third gate electrode 118C may be connected to first gate electrode 118A in first transistor 133, and fourth gate electrode 118D may be connected to second gate electrode 118B in second transistor 134.

In this way, first transistor 133 is on while an on voltage is being applied to first gate electrode 118A of semiconductor element 101, and second transistor 134 is on while an on voltage is being applied to second gate electrode 118B of semiconductor element 101. In this way, when the potential of rear surface electrode 153 is lower than one of the potential of first ohmic electrode 116A and the potential of second ohmic electrode 116B, it is possible to increase and stabilize a substrate potential via one of the first transistor and the second transistor.

It is to be noted that each of the diodes included in auxiliary diode unit 204 may be a multi-fingered diode.

The fingers of fifth gate electrode 118E and the fingers of sixth gate electrode 118F, which are not illustrated in FIGS. 10A and 10B, are formed above fifth p-type semiconductor layer 119E and fourth p-type semiconductor layer 119F.

In addition, substrate electrode pad 163 is electrically connected to rear surface electrode 153 via a wire or the like. When substrate electrode pad 163 is housed in a package, it is only necessary that substrate electrode pad 163 is electrically connected by placing the wire connected to substrate electrode pad 163 on a die pad connected to rear surface electrode 153.

In this way, substrate potential stabilizer 403 including auxiliary transistor unit 202 and auxiliary diode unit 204 is formed.

Embodiment 5

Next, bidirectional switch 100 according to Embodiment 5 is described with reference to the drawings. It is to be noted that, in this embodiment, substantially the same portions as in FIG. 3 are assigned the same reference numerals and are not repeatedly described.

(Circuit Configuration of Bidirectional Switch)

Figure 11:
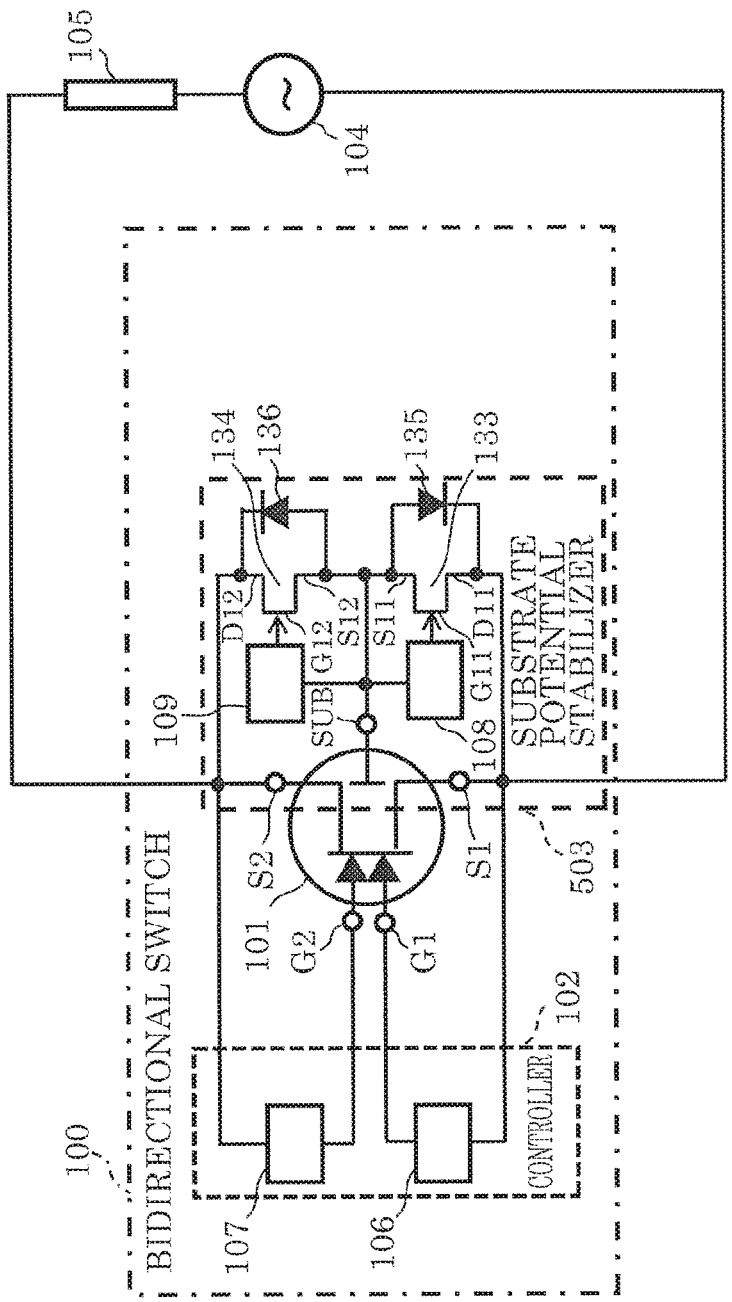
FIG. 11 is a diagram illustrating an example of a circuit configuration indicating a bidirectional switch according to Embodiment 5, a load, and a power supply.

FIG. 11 is a diagram illustrating an example of a circuit configuration indicating bidirectional switch 100 according to this embodiment, load 105, and power supply 104. Unlike bidirectional switch 100 in FIG. 3, bidirectional switch 100 in FIG. 11 includes substrate potential stabilizer 503 instead of substrate potential stabilizer 103. The differences are mainly described below.

As illustrated in FIG. 11, substrate potential stabilizer 503 includes: first transistor 133; second transistor 134; first diode 135; second diode 136; third gate control circuit 108; and fourth gate control circuit 109.

First transistor 133 and first diode 135 are connected between substrate terminal SUB and terminal S1. Second transistor 134 and second diode 136 are connected between substrate terminal SUB and terminal S2. Source terminal S11 of first transistor 133 and source terminal S12 of second transistor 134 are connected to substrate terminal SUB. In addition, source terminal S11 of first transistor 133 is connected to terminal S1. Source terminal S12 of second transistor 134 is connected to terminal S2. Source terminal S11 of first transistor 133 and the anode of first diode 135 are connected to each other. Drain terminal D11 of first transistor 133 and the cathode of first diode 135 are connected to each other. In addition, source terminal S12 of second transistor 134 and the anode of second diode 136 are connected to each other. Drain terminal D12 of second transistor 134 and the cathode of second diode 136 are connected to each other.

It is to be noted that, when each of first transistor 133 and second transistor 134 has a body diode, there is no need to separately provide first diode 135 and second diode 136.

Hereinafter, operations performed by substrate potential stabilizer 503 in FIG. 11 are described. A case where the potential of terminal S2 is higher than that of terminal S1 is described. As in Embodiment 2, the timing chart of each of the gates is the same as in FIG. 5. A case where the potential of terminal S2 is higher than that of terminal S1 is specifically described. When semiconductor element 101 turns off, the potential of terminal S2 with respect to the potential of substrate terminal SUB increases. Charge current flows in a parasitic capacitor between rear surface electrode 153 and second ohmic electrode 116B, and second transistor 134 is on. Thus, current flows from the drain terminal to the source terminal. Although the current charges the parasitic capacitor between rear surface electrode 153 and first ohmic electrode 116A, most of the current flows in first transistor 133 and first diode 135 which are on, and thus the potential of substrate terminal SUB is approximately the same as the potential of terminal S1. Even after first transistor 133 turns off, with the presence of diode 135, the potential of substrate terminal SUB can be stabilized at the potential that is higher than the potential of terminal S1 by the amount corresponding to a forward voltage of first diode 135. In addition, when semiconductor element 101 turns on, the potential of terminal S2 becomes closer to the potential of substrate terminal SUB. Since substrate terminal SUB is short-circuited with terminal S2 and terminal S1 by first transistor 133 and second transistor 134 which are on, the potential of substrate terminal SUB becomes approximately the same as the potential of terminal S1 and can be stabilized. Likewise, when the potential of terminal S1 is higher than the potential of terminal S2, the potential of substrate terminal SUB follows the potential of terminal S2.

(Timing Charts)

Figure 12A:
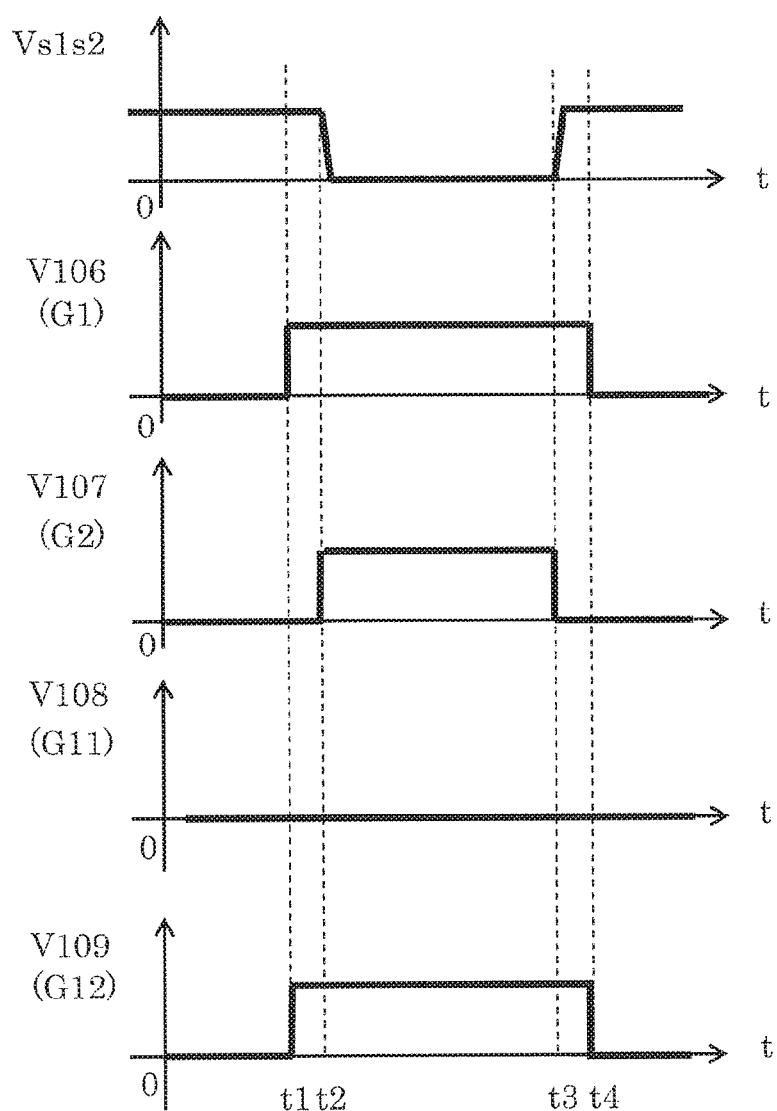
FIG. 12A is a diagram indicating timing charts in examples of operations performed by the bidirectional switch.

Next, operations performed by substrate potential stabilizer 503 are described. FIG. 12A is a diagram indicating timing charts in examples of operations performed by bidirectional switch 100. In FIG. 12A, signal Vs1s2 indicates a potential of terminal S1 with respect to a potential of terminal S2. Other signals etc. are the same as in FIG. 5.

As illustrated in FIG. 12A, a case where the potential of terminal S1 is higher than the potential of terminal S2 when semiconductor element 101 is off is described. It is to be noted that time t1, t2, t3, and t4 are, for example, approximately 20 μseconds, approximately 30 μseconds, approximately 70 μseconds, and approximately 80 μseconds, respectively, with respect to time 0 (second).

At time t1, first gate control circuit 106 outputs signal V106 for turning on the gate of semiconductor element 101 before second gate control circuit 107 outputs the signal. At this time, terminal G2 is off, and thus semiconductor element 101 is off. In addition, at time t1, fourth gate control circuit 109 applies an on voltage of signal V109. Substrate terminal SUB and terminal S2 are conductive via second transistor 134, and thus the potential of substrate terminal SUB is approximately the same as the potential of terminal S2. At time t2, signal V107 for turning on the gate of semiconductor element 101 is output from second gate control circuit 107 to turn on semiconductor element 101. The potential of substrate terminal SUB remains approximately equal to the potential of terminal S2. Accordingly, it is possible to prevent a substrate potential from becoming unstable.

Next, at time t3, signal V107 for turning off second gate control circuit 107 is output to turn off semiconductor element 101. Since second transistor 134 is conductive, the potential of substrate terminal SUB is approximately the same as the potential of terminal S2. At time t4, first gate control circuit 106 and fourth gate control circuit 109 output turn-off signals V106 and V109, respectively. As described above, the potential of substrate terminal SUB is stabilized. In addition, substrate terminal SUB and terminal S2 are short-circuited when semiconductor element 101 turns on and off, a capacitor between terminal G1 and terminal G2 that determine switching speed is comparatively smaller than in the case where substrate terminal SUB is not short-circuited with terminal S2. As a result, an effect of reducing switching loss can be expected.

Figure 12B:
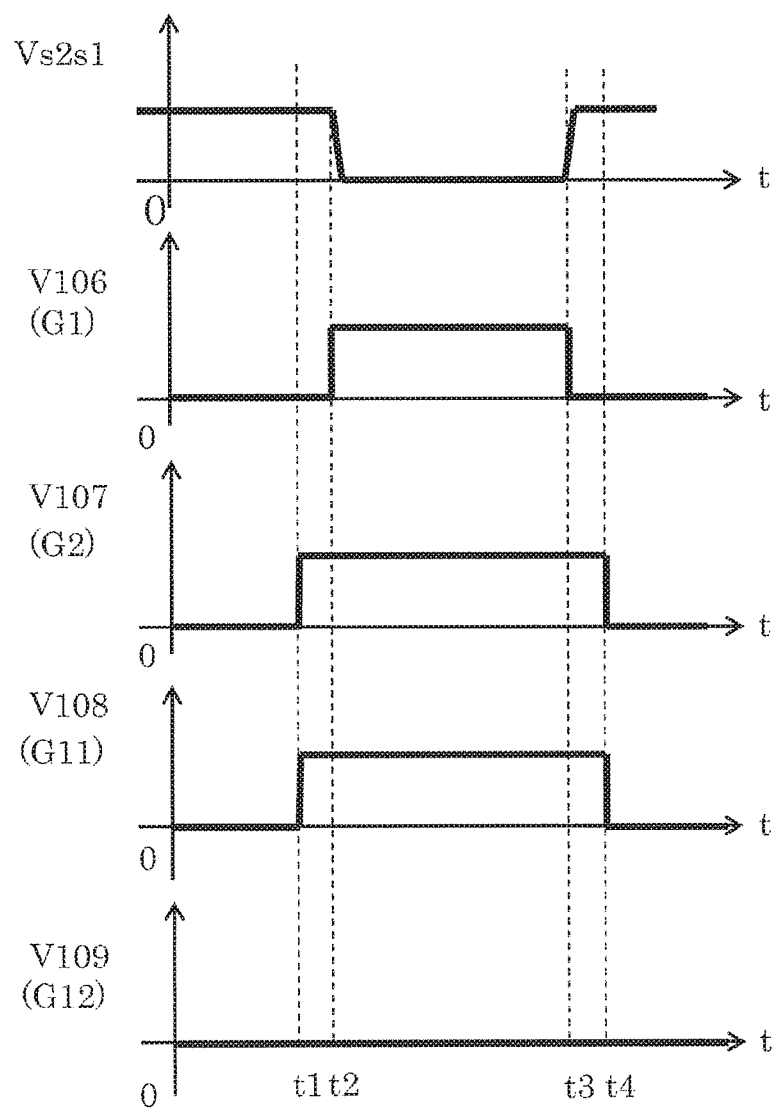
FIG. 12B is a diagram indicating a timing chart in an operation example of the bidirectional switch.

Next, as illustrated in FIG. 12B, a case where the potential of terminal S2 is higher than the potential of terminal S1 when semiconductor element 101 is described. FIG. 12B is a diagram indicating timing charts in examples of operations performed by bidirectional switch 100.

At time t1, second gate control circuit 107 applies an on voltage of signal V107 before first gate control circuit 106 applies the voltage. Since terminal G1 is off semiconductor element 101 is off. In addition, at time t1, third gate control circuit 108 applies an on voltage of signal V108. In this way, substrate terminal SUB and terminal S1 are conductive via first transistor 133, and thus the potential of substrate terminal SUB is approximately the same as the potential of terminal S1 and is stabilized. At time t2, signal V106 for turning on first transistor 133 is output from first gate control circuit 106 to turn on semiconductor element 101. At this time, the potential of substrate terminal SUB remains approximately equal to the potential of terminal S1. At time t3, signal V106 for turning off first transistor 133 is output to turn off semiconductor element 101. At this time, since first transistor 133 is conductive, the potential of substrate terminal SU B is approximately the same as the potential of terminal S1. At time t4, second gate control circuit 107 and third gate control circuit 108 output signals V107 and V108 for turning off first transistor 133, respectively. In this way, semiconductor element 101 turns off.

As described above, the potential of substrate terminal SUB is stabilized. In addition, substrate terminal SUB and terminal S1 are short-circuited when semiconductor element 101 turns on and off, a capacitor between terminal G1 and terminal G2 that determine switching speed is comparatively smaller than in the case where substrate terminal SUB is not short-circuited with terminal S1. As a result, an effect of reducing switching loss can be expected.

It is to be noted that the values of time t1, t2, t3, and t4 are non-limiting examples.

(Plan-View Configuration of Bidirectional Switch)

Figure 13A:
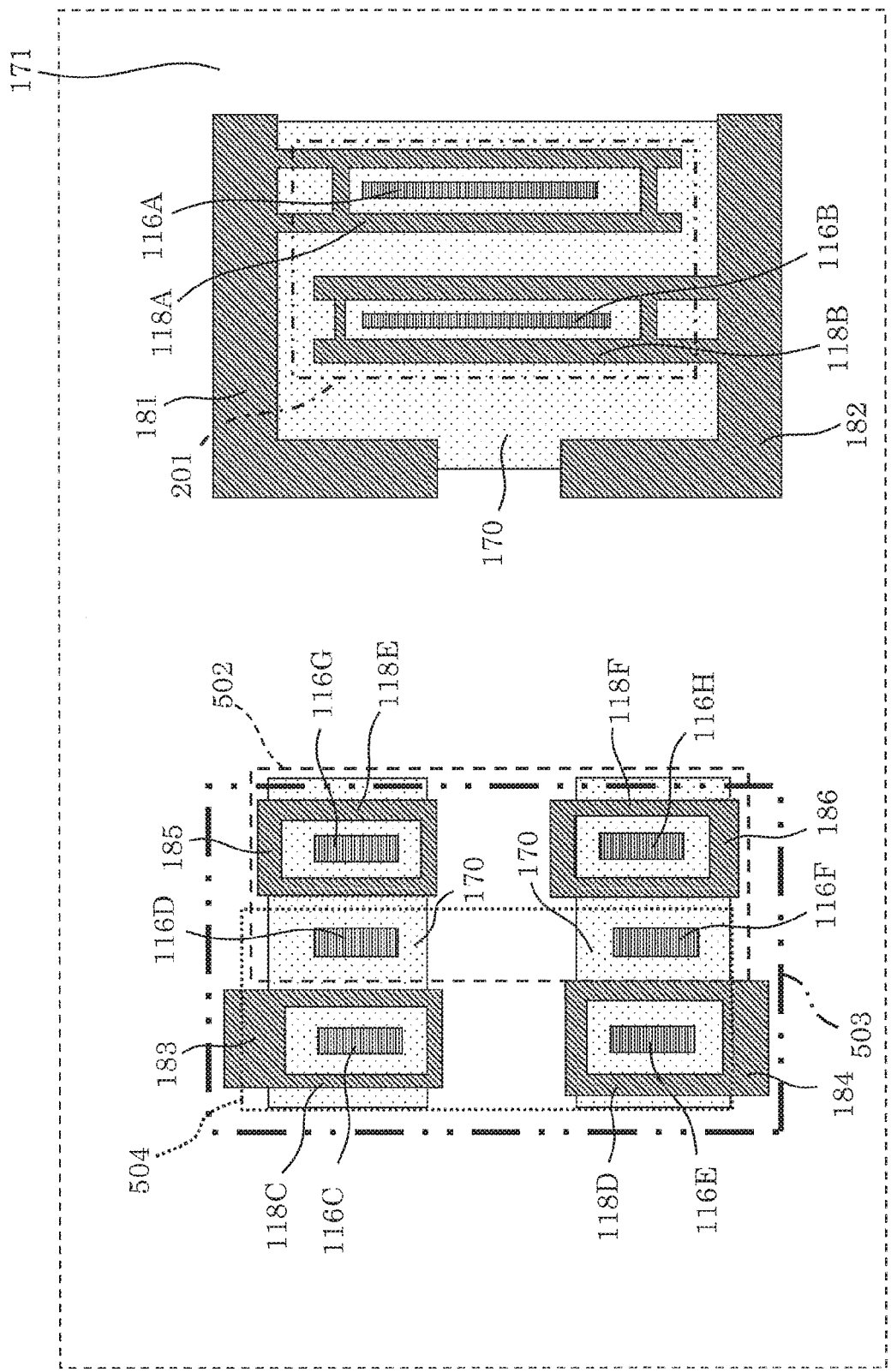
FIG. 13A is a plan view indicating a wiring layout of a bidirectional switch.
Figure 13B:
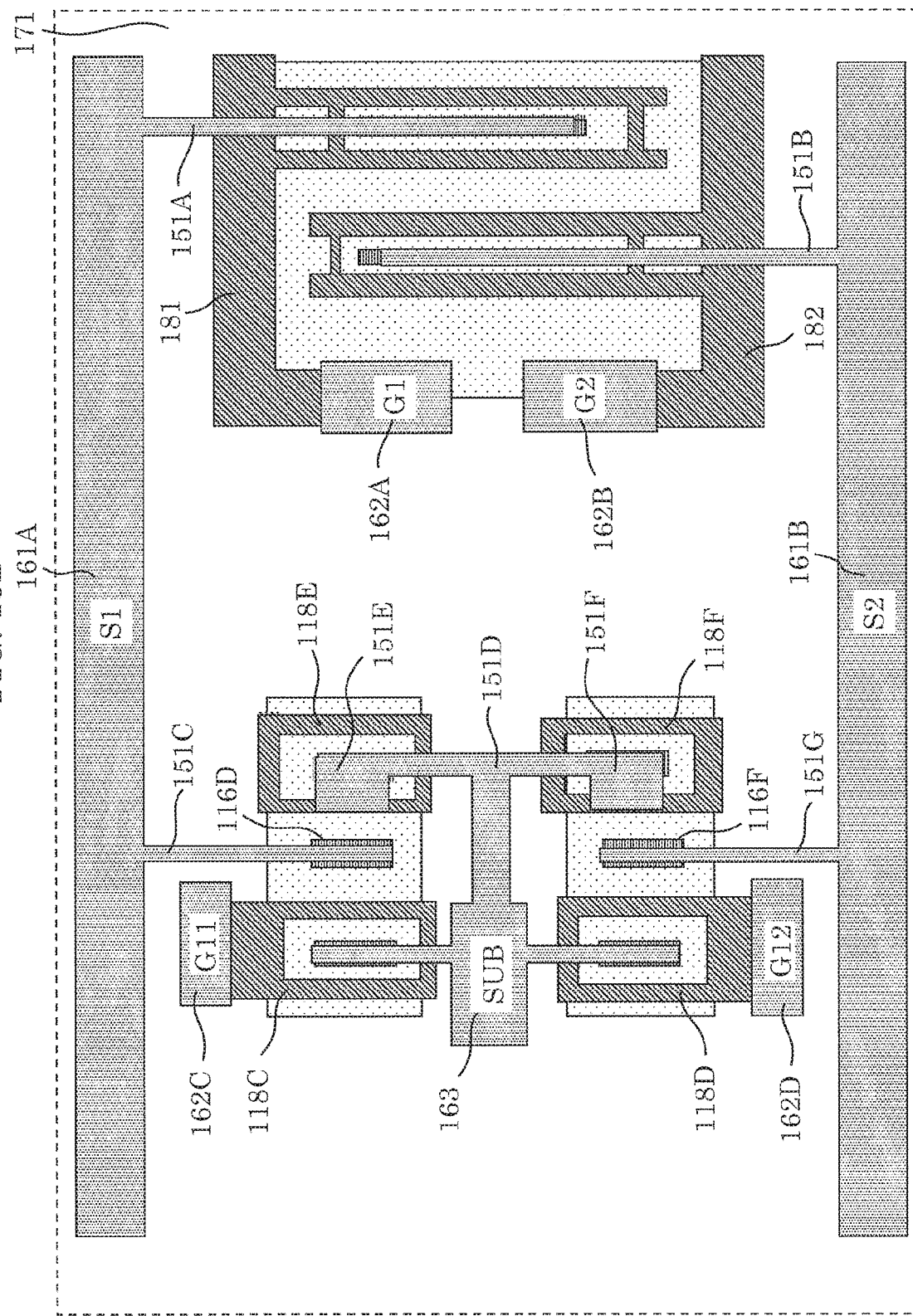
FIG. 13B is a plan view indicating a wiring layout of a bidirectional switch.

FIGS. 13A and 13B are each a plan view of a wiring layout of semiconductor element 101 and substrate potential stabilizer 503 in a bidirectional switch according to this embodiment. FIG. 13A is a plan view before providing S1 electrode pad 161A, G1 electrode pad 162A, S2 electrode pad 161B, G2 electrode pad 162B, and substrate electrode pad 163 illustrated in FIG. 13B. In addition, FIG. 13B is a plan view after S1 electrode pad 161A, G1 electrode pad 162A, S2 electrode pad 161B, G2 electrode pad 162B, and substrate electrode pad 163 are provided.

Substrate potential stabilizer 503 illustrated in FIGS. 13A and 13B includes auxiliary transistor unit 502 and auxiliary diode unit 504 instead of auxiliary transistor unit 202 and auxiliary diode unit 204 included in substrate potential stabilizer 403 in FIGS. 10A and 10B. The differences are mainly described below. Auxiliary transistor unit 502 corresponds to first transistor 133 and second transistor 134 included in substrate potential stabilizer 503. Auxiliary diode unit 504 corresponds to first diode 135 and second diode 136 included in substrate potential stabilizer 503.

Auxiliary transistor unit 502 includes: third ohmic electrode 116C, fourth ohmic electrode 116D, fifth ohmic electrode 116E, and sixth ohmic electrode 116F formed therein. The fingers of third ohmic electrode 116C and the fingers of fourth ohmic electrode 116D are formed to be parallel to each other. Fingers of third gate electrode 118C are formed between the fingers of third ohmic electrode 116C and the fingers of fourth ohmic electrode 116D. The fingers of fifth ohmic electrode 116E and the fingers of sixth ohmic electrode 116F are formed to be parallel to each other. Fingers of fourth gate electrode 118D are formed between the fingers of fifth ohmic electrode 116E and the fingers of sixth ohmic electrode 116F. Third ohmic electrode 116C is connected to substrate electrode pad 163 via electrode wiring 151C. Fourth ohmic electrode 116D is connected to S1 electrode pad 161A via electrode wiring 151D. Fifth ohmic electrode 116E is connected to substrate electrode pad 163 via electrode wiring 151C. Third gate electrode 118C is connected to G3 electrode pad 162C. G3 electrode pad 162C corresponds to gate terminal G11 in FIG. 11. Fourth gate electrode 118D is connected to G4 electrode pad 162D. G4 electrode pad 162D corresponds to gate terminal G12 in FIG. 11.

Auxiliary diode unit 504 includes: seventh ohmic electrode 116G; eighth ohmic electrode 116H; fifth gate electrode 118E; and sixth gate electrode 118F formed therein. Fifth gate electrode 118E is formed to enclose seventh ohmic electrode 116G. Fifth gate electrode 118E is connected to seventh ohmic electrode 116G and electrode wiring 151E. In this way, first diode 135 having fourth ohmic electrode 116D as the cathode is formed. Sixth gate electrode 118F is formed to enclose eighth ohmic electrode 11H. Sixth gate electrode 118F is connected to eighth ohmic electrode 116H and electrode wiring 151F. In this way, second diode 136 having sixth ohmic electrode 116F as the cathode is formed. In this way, substrate potential stabilizer 503 including auxiliary transistor unit 502 and auxiliary diode unit 504 is formed.

In this embodiment, semiconductor element 101 is a normally-off dual gate semiconductor element on which the gate electrode is formed on the p-type semiconductor layer. However, normally-off characteristics may be achieved by forming a gate recess or thinning the second semiconductor layer.

As described above, in bidirectional switch 100 according to Embodiment 5: third ohmic electrode 116C is a drain electrode (corresponding to drain terminal D11) and fourth ohmic electrode 116D is a source electrode (corresponding to source terminal S11) in first transistor 133; and fifth ohmic electrode 116E is a drain electrode (corresponding to drain terminal D12) and sixth ohmic electrode 116F is a source electrode (corresponding to source terminal S12) in second transistor 134.

In this way, it is possible to stabilize a substrate potential for maintaining rear surface electrode 153 conductive with one of first ohmic electrode 116A and second ohmic electrode 116B which has a potential lower than the potential of the other.

Bidirectional switch 100 according to the present disclosure operates stably even when a semiconductor having a wide band gap is formed on a substrate, and is particularly applicable as a bidirectional switch or the like made of a nitride semiconductor formed on the substrate.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The bidirectional switch according to the present disclosure is capable of operating stably, and thus is particularly applicable for stabilizing, for example, operations by a main switch of a matrix converter, operations by a main switch of a semiconductor relay, etc.

What is claimed is:

1. A bidirectional switch, comprising:
a semiconductor element; and
a substrate potential stabilizer, wherein
the semiconductor element includes:
   a substrate;
   a semiconductor stack on a first surface of the substrate;
   a first ohmic electrode and a second ohmic electrode on the semiconductor stack, the first ohmic electrode and the second ohmic electrode being spaced apart from each other;
   a first gate electrode and a second gate electrode between the first ohmic electrode and the second ohmic electrode, in order starting from a side of the first ohmic electrode; and
   a rear surface electrode on a second surface of the substrate opposite to the first surface on which the semiconductor stack is formed,
the substrate potential stabilizer includes:
   a first switch element which connects the first ohmic electrode and the rear surface electrode;
   a second switch element which connects the second ohmic electrode and the rear surface electrode; and
   circuitry configured to cause the first switch element and the second switch element to be conductive when the semiconductor element is on,
the first switch element includes a first transistor, and the second switch element includes a second transistor,
the first transistor includes a third ohmic electrode, a fourth ohmic electrode, and a third gate electrode between the third ohmic electrode and the fourth ohmic electrode,
the second transistor includes a fifth ohmic electrode, a sixth ohmic electrode, and a fourth gate electrode between the fifth ohmic electrode and the sixth ohmic electrode,
the third ohmic electrode and the first ohmic electrode are connected to each other,
the fourth ohmic electrode and the rear surface electrode are connected to each other,
the fifth ohmic electrode and the second ohmic electrode are connected to each other, and
the sixth ohmic electrode and the rear surface electrode are connected to each other.

2. The bidirectional switch according to claim 1,
wherein, in the first transistor, the third ohmic electrode is a source electrode, and the fourth ohmic electrode is a drain electrode, and
in the second transistor, the fifth ohmic electrode is a source electrode, and the sixth ohmic electrode is a drain electrode.

3. The bidirectional switch according to claim 2,
wherein, in the first transistor, the third gate electrode is connected to the first gate electrode, and
in the second transistor, the fourth gate electrode is connected to the second gate electrode.

4. The bidirectional switch according to claim 1,
wherein, in the first transistor, the third ohmic electrode is a drain electrode, and the fourth ohmic electrode is a source electrode, and
in the second transistor, the fifth ohmic electrode is a drain electrode, and the sixth ohmic electrode is a source electrode.

5. The bidirectional switch according to claim 1,
wherein, when a potential of the second ohmic electrode is higher than a potential of the first ohmic electrode, an ON voltage is applied to the third gate electrode before being applied to the first gate electrode, and
when a potential of the first ohmic electrode is higher than a potential of the second ohmic electrode, an ON voltage is applied to the fourth gate electrode before being applied to the second gate electrode.

6. The bidirectional switch according to claim 1,
wherein the semiconductor stack, the first switch element, and the second switch element include a nitride semiconductor.

7. A bidirectional switch, comprising:
a semiconductor element; and
a substrate potential stabilizer,
the semiconductor element including:
  a substrate;
  a semiconductor stack on a first surface of the substrate;
  a first ohmic electrode and a second ohmic electrode on the semiconductor stack, the first ohmic electrode and the second ohmic electrode being spaced apart from each other;
  a first gate electrode and a second gate electrode between the first ohmic electrode and the second ohmic electrode, in order starting from a side of the first ohmic electrode; and
  a rear surface electrode on a second surface of the substrate opposite to the first surface on which the semiconductor stack is formed,
the substrate potential stabilizer including:
  a first transistor which connects the first ohmic electrode and the rear surface electrode; and
  a second transistor which connects the second ohmic electrode and the rear surface electrode,
the first transistor including:
  a first source electrode;
  a first drain electrode; and
  a third gate electrode between the first source electrode and the first drain electrode, and
the second transistor including:
  a second source electrode;
  a second drain electrode; and
  a fourth gate electrode between the second source electrode and the second drain electrode,
wherein the first source electrode is connected to the first ohmic electrode,
the first drain electrode is connected to the rear surface electrode,
the second drain electrode is connected to the rear surface electrode, and
the second source electrode is connected to the second ohmic electrode,
the substrate potential stabilizer includes a p-type semiconductor layer between the semiconductor stack and the third gate electrode, and a p-type semiconductor layer between the semiconductor stack and the fourth gate electrode,
the third gate electrode is connected to the first source electrode, and
the fourth gate electrode is connected to the second source electrode.

8. The bidirectional switch according to claim 7,
wherein, when a potential of the second ohmic electrode is higher than a potential of the first ohmic electrode, an ON voltage is applied to the third gate electrode before being applied to the first gate electrode, and
when a potential of the first ohmic electrode is higher than a potential of the second ohmic electrode, an ON voltage is applied to the fourth gate electrode before being applied to the second gate electrode.

9. The bidirectional switch according to claim 7,
wherein the semiconductor stack, the first transistor, and the second transistor include a nitride semiconductor.

* * * * *